(12) United States Patent
Murray

(10) Patent No.: US 10,727,626 B2
(45) Date of Patent: Jul. 28, 2020

(54) 8P8C AND 16P16C CONNECTORS, NETWORK SWITCH, AND SYSTEM AND METHOD OF RACKING AND CABLING SWITCHES AND SERVERS

(71) Applicant: Dean Murray, St. George, UT (US)

(72) Inventor: Dean Murray, St. George, UT (US)

(*) Notice: Subject to any disclaimer, the term of this patent is extended or adjusted under 35 U.S.C. 154(b) by 0 days.

(21) Appl. No.: 16/246,170

(22) Filed: Jan. 11, 2019

(65) Prior Publication Data

US 2019/0214766 A1    Jul. 11, 2019

Related U.S. Application Data

(60) Provisional application No. 62/657,164, filed on Apr. 13, 2018, provisional application No. 62/616,092, filed on Jan. 11, 2018.

(51) Int. Cl.

| | |
|---|---|
| *H01R 13/60* | (2006.01) |
| *H01R 13/629* | (2006.01) |
| *H01R 13/639* | (2006.01) |
| *H01R 24/20* | (2011.01) |
| *H01R 13/627* | (2006.01) |
| *H01R 24/64* | (2011.01) |
| *H05K 7/14* | (2006.01) |
| *H05K 5/02* | (2006.01) |

(52) U.S. Cl.
CPC ....... *H01R 13/629* (2013.01); *H01R 13/6272* (2013.01); *H01R 13/639* (2013.01); *H01R 24/20* (2013.01); *H01R 24/64* (2013.01); *H01R 2201/04* (2013.01); *H05K 5/0247* (2013.01); *H05K 7/1491* (2013.01)

(58) Field of Classification Search
CPC .... H01R 13/629; H01R 13/639; H01R 24/20; H01R 2201/04; H01R 24/64; H01R 13/6272; H05K 7/1491; H05K 5/0247
USPC ......................................................... 439/260
See application file for complete search history.

(56) References Cited

U.S. PATENT DOCUMENTS

| | | | |
|---|---|---|---|
| 9,716,355 B1* | 7/2017 | Cole ................. | H01R 24/64 |
| 9,905,973 B2* | 2/2018 | Schumacher ...... | H01R 13/6466 |
| 2012/0129382 A1* | 5/2012 | Regnier ............. | H01R 4/2429 |
| | | | 439/421 |
| 2019/0214766 A1* | 7/2019 | Murray ............. | H01R 13/629 |

* cited by examiner

*Primary Examiner* — Abdullah A Riyami
*Assistant Examiner* — Nelson R. Burgos-Guntin
(74) *Attorney, Agent, or Firm* — Gurr Brande & Spendlove, PLLC; Robert A. Gurr

(57) ABSTRACT

An male modular connector (e.g., 8P8C) has a first set of electrical contacts on a first side and a second set of electrical contacts on an opposite, second side; and an elongated housing (in comparison to the IEC standards) so as to allow the retaining clip of the male modular connector to be shifted farther back so as to not interfere with the connection between the pins and the electrical contacts of a female modular connector.

A network switch has a non-cuboidal housing comprising two or more sidewalls, each sidewall comprising a plurality of female connectors (such as 8P8C, 16P16C, fiber optic, or other connector); and wherein some or all of the female connectors are parallel to the sides of the cabinet.

The network switch is mounted from the front of the cabinet, with cables running horizontally to other cabinets and various mechanisms for protecting, organizing and managing the cables.

11 Claims, 33 Drawing Sheets

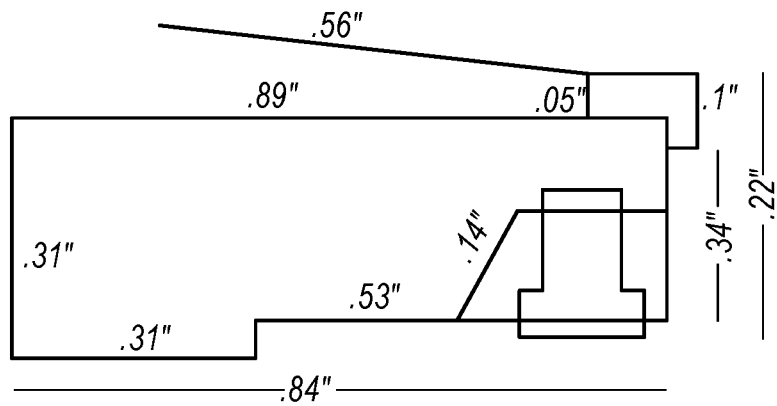
Fig. 1A (Prior Art)
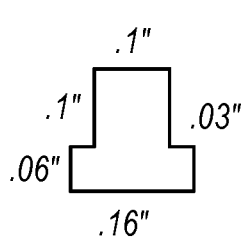 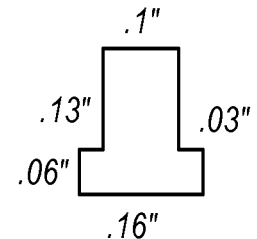
Fig. 1B (Prior Art)   Fig. 1C (Prior Art)
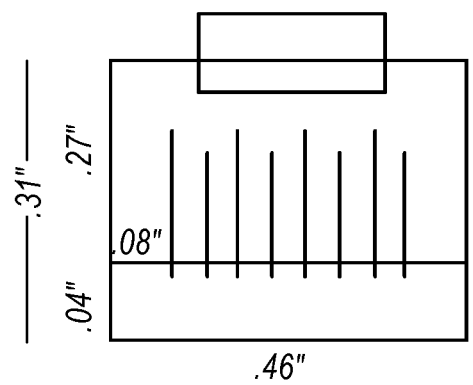
Fig. 1D (Prior Art)

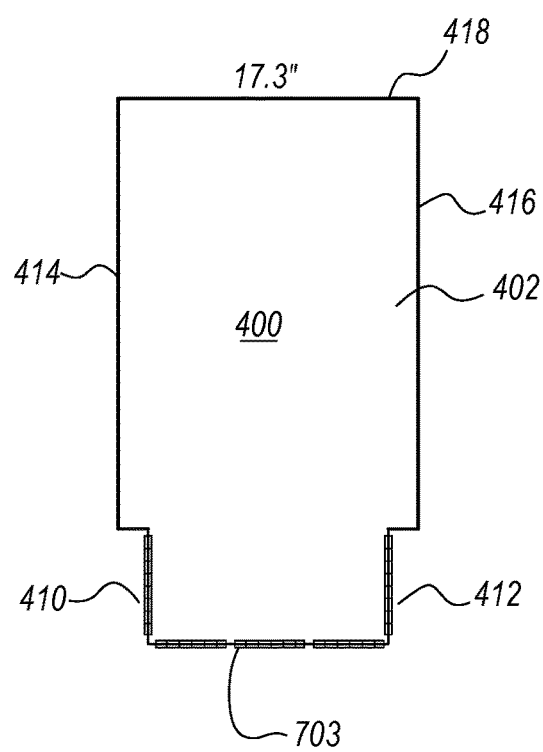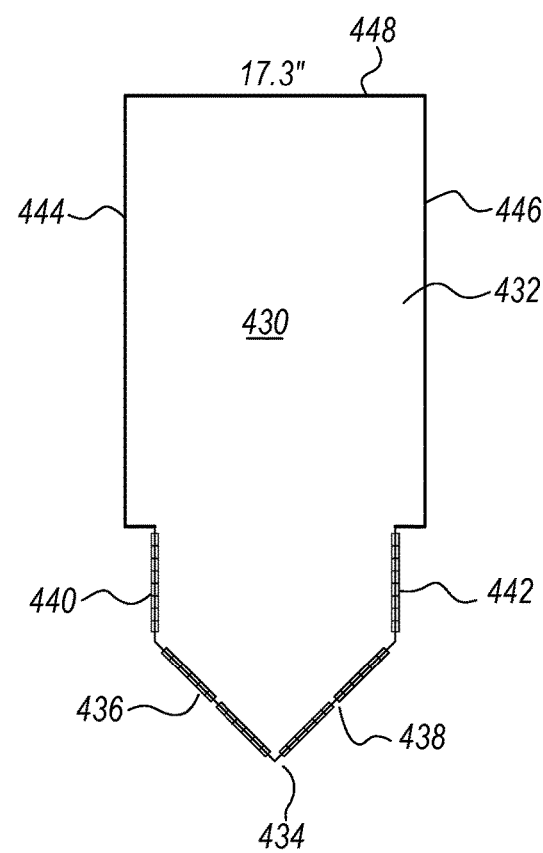
Fig. 11
Fig. 12

8P8C AND 16P16C CONNECTORS, NETWORK SWITCH, AND SYSTEM AND METHOD OF RACKING AND CABLING SWITCHES AND SERVERS

CROSS-REFERENCE TO RELATED APPLICATIONS

This application claims the benefit of U.S. Provisional Application Ser. No. 62/616,092, filed on Jan. 11, 2018, and U.S. Provisional Application Ser. No. 62/657,164, filed on Apr. 13, 2018, both of which are incorporated herein by reference.

TECHNICAL FIELD

The present disclosure relates to data centers and cabinets therein. More particularly, the present disclosure relates to a redesigned RJ45 connector (modular or 8P8C connector), a network switch, a cabinet, and a system and method for racking and cabling switches and servers so as to increase capacity and efficiency.

BACKGROUND

The need for more data centers and for those data centers to be larger, more efficient and provide more capacity is growing on a daily basis. Due to increased need and the high cost of building new data center space, it is important to make the most of the available data center space. The industry standard of racking servers in cabinets designed to stack servers vertically has done a lot to ensure that the available cubic space is efficiently utilized, but there are still additional refinements that can be made to further increase the amount of computational power that can be put into a given data center. Despite the use of blade servers and micro clouds, space—and the investment into switching hardware—is not efficiently used due to the server-switch connections, and the physical configuration of hardware in current data centers. In other words, it is not uncommon to have either 1) less than 100% utilization of switch ports, or 2) 100% utilization of switch ports, but less than 100% utilization of the cabinet slots.

Several constraints prevent greater efficiency. For example, the current designs for both cabinets and the rails require that the network cables run vertically. Top-of-rack switches are roughly half as long as servers (they take up only half of the depth of their slot in the cabinet). Current industry practice is to rack all servers from the front of the cabinet (e.g., servers are inserted into the rails from the front of the cabinet and then bolted to the front of the cabinet to stop them from sliding back out). Switches, on the other hand, are racked from the back of the cabinet—presumably because they are short and the goal is to have the back of the switch flush with the backs of the servers—rather than being positioned in the middle of the cabinet where the ports would be unreachable. Once a switch has been racked and the network cabling and power distribution has been run, it can, depending on where in the cabinet the switch has been racked, become difficult or even impossible to pull the switch back out of the rack without also removing the network cables and/or power distribution units mounted behind the switch. Companies are then faced with the decision of mounting switches in the middle of the cabinet (creating severe difficulties when removing/replacing the switch), or placing the switch at the top of the cabinet (above the power distribution units so that it is easier to remove the switch in the event that it needs to be replaced). Placing the switch in the middle of the cabinet, or more specifically vertically in the middle of the servers which are to be connected to the switch means that, on average, the networking cables are one-fourth the aggregate vertical height of the servers connected to a switch plus the length needed to get from the port on the server over to the side of the cabinet and then over from the side of the cabinet to the relevant port on the switch. Placing the switch at the top of the cabinet, generally the preferred positioning because of the increased difficulty in replacing switches mounted in the middle of the cabinet, means that, on average, the networking cables are one-half the height of the cabinet plus the length needed to get from the port on the server over to the side of the cabinet and then over from the side of the cabinet to the relevant port on the switch. The longer cables associated with positioning switches in the top of the cabinet are more expensive and contribute to increased failure rates due to the increased weight, and stress, on the connecting ports. Further, networking cables can take up a significant amount of space and reduce the flow of air through the cabinet (potentially causing the overheating of electronic equipment and premature failure of the hardware) if not managed correctly. As a result, cables are typically run in a tight group up and down one side of the cabinet.

Accordingly, cable management systems taking up two slots, or 2U, are generally placed above the top-of-rack switch to both bear the weight of the cables (thereby reducing the rate of port failure due to unsupported cables), and keep the cables organized. However, this cable management system uses about 4% of the available space in a standard 48-unit cabinet, which is critical space. Placing switches in a position other than the top of the cabinet means that the fiber optics cables running from the top-of-rack switch to the network core are exposed to potential jostling and damage any time a data center tech works on one of the servers positioned above the switch in the cabinet. This can potentially lead to downtime not just for one or two servers, but for all of the servers connected to a given switch.

If one considers a switch, its cable management system, and all of the servers attached to the switch to be a "logical computing unit" or LCU, then the above considerations generally mean that any given LCU is limited to a single cabinet. If the physical space in the cabinet is exhausted before the networking ports on the switch are fully utilized, there is no other option but to either accept less than 100% utilization of the switch ports (and therefore waste some of the capital expenditure involved in purchasing the switch), or downgrade to a less expensive switch that has fewer network ports—leaving one or more units of rack space unused. As such, there is a need for a system and method that allows 100% utilization of switch ports while fully utilizing rack space, without increasing failure rates or increasing downtime due to other considerations (server/switch replacement; overheating; cable jostling; etc.)

A further restriction on the utilization of space in an LCU is the configuration of the switch and port connectors. A normal RJ45 ethernet networking port has a width of about 0.46 inches. The female connector into which an RJ45 port is inserted into requires about 0.55 inches. One unit (U) of cabinet space has a usable width (allowing for mounting hardware) of about 17.3 inches. Stacking switch ports vertically works for a stack of two ports because the top ports are oriented so that the retention clips are on the top of the plug while the bottom ports are oriented so that the retention clips on the bottom plugs are pointing downwards. This means that introducing a third row of ports makes it difficult or even impossible to depress the retention clip holding the cable in place.

Placing 24 switch ports side-by-side along the face of the switch consumes more than 13 of the 17.3 inches of the available horizontal space into which link lights, a bezel, uplink ports, and venting holes for waste heat must also fit.

One attempt at solving this problem is found in U.S. Pat. No. 8,600,208 to Badar et al. The '208 patent seeks to increase the surface area available for switch ports by taking advantage of the space on the front of the switch and angling the back of the switch in a triangular fashion. However, this has several issues. Using the front of the switch for ports introduces cabling difficulties because the copper wires have to be run from the back of the servers to the front of the switch. The utilization of the front of the switch for switch ports interferes with the flow of air through the switch and therefore complicates the cooling of the switch. Further, while the angled face on the back of the switch provides increased surface area for switch ports, it makes the majority of the RJ45 ports inaccessible due to their position deeper inside the cabinet and the limited distance between the servers above and/or below the switch. This makes it difficult to plug and unplug the network cables.

Another attempted solution is taught in U.S. Pat. No. 9,461,422 to Yuen. The '422 patent discloses a micro ethernet connector, but fails to disclose a method of coupling the cable to the circuit board disclosed. Accordingly, a reasonable assumption is to solder the cable to the connector. However, while this may be feasible in high-precision manufacturing environments, it isn't a viable option for use in a data center, where technicians are constantly cutting cords to differing lengths and replacing coupling connectors. Therefore, there is a need for a modular connector that technicians can easily connect to cables and that takes up less space than the current RJ45 connector.

Further, electronic components inside of the switch generate waste heat which must be vented in order to prevent the switch for overheating and prematurely failing. U.S. Patent publication US20160128230A1 to Lam et al. seeks to address the issue of waste heat by angling the top and/or bottom panel of the switch down to meet a slightly smaller back face plate. However, in instances of increased ports and associated components, there will arise a need for better methods to effectively dissipate waste heat.

Accordingly, the present disclosure seeks to solve the above-mentioned problems and others.

SUMMARY OF EXAMPLE EMBODIMENTS

In one embodiment, an 8P8C connector (a modular connector) comprises a housing having a cable receiving end and a coupling end, wherein the coupling end comprises a first set of electrical contacts (e.g., copper pins) on a first (e.g., top) side and a second set of electrical contacts on an opposite, second (e.g., bottom) side; both sets of contacts being exposed for coupling with a female connector; and an elongated housing so as to allow for the retaining clip of the male connector to be shifted farther back so as to not interfere with the connection between the electrical contacts and the electrical contacts of a female connector. In one embodiment, the modular connector may further comprise a keyed portion to ensure correct orientation of an insert containing wires into the housing.

In one embodiment, a 16P16C connector (a modular connector) comprises a housing having a cable receiving end and a coupling end, wherein the coupling end comprises a first set of eight electrical contacts on a top side and a second set of eight electrical contacts on an opposite, bottom side; both sets of pins being exposed for coupling with a female connector; a keyed portion to ensure correct orientation of an insert containing wires into housing; and an elongated housing so as to allow the retaining clip to be shifted farther back so as to not interfere with the connection between the pins and the electrical contacts of a female connector.

In one embodiment, an 8P8C connector comprises a housing having a cable receiving end and a coupling end, wherein the coupling end comprises a set of electrical contacts on the bottom side; the contacts being exposed for coupling with electrical contacts in a female connector; a keyed protrusion may also be used to ensure correct orientation of an insert containing the wires into the housing; the vertical height of the housing being shortened to reduce the required surface area on the faceplate of a switch and therefore allow for additional venting of waste heat.

In one embodiment, a network switch comprises a non-cuboidal housing wherein at least a portion of the housing comprises angled sidewalls, the angled sidewalls being angled from a first position adjacent to the sides of a cabinet, to a second position away from the cabinet, the angled sidewalls comprising a plurality of female receiving connectors (such as 8P8C, 16P16C, fiber optic, or other connectors); and wherein the female receiving connectors range in orientation from parallel to the sides of the cabinet to perpendicular to the sides of the cabinet.

In one embodiment, a network switch comprises a non-cuboidal housing, wherein one or more rear sides of the housing each comprise three surface areas, each surface area comprising a plurality of receiving connectors wherein the receiving connectors are configured to be substantially parallel to the sides of a cabinet; and, the housing comprising a flat section at a rear portion for venting heat.

In one embodiment, a network switch comprises a non-cuboidal housing having connection sidewalls comprising a plurality of network receiving connectors, the network receiving connectors being substantially parallel to the rails of the cabinet and spaced sufficiently from the rails to allow a male connector to be inserted in to the network receiving connectors; and one or more rear sidewalls, each rear sidewall comprising a plurality of network receiving connectors.

In one embodiment, a switch comprises an angled rear sidewall to aid in venting waste heat. In one embodiment, the switch is racked so that the rear sidewall extends beyond the rear of the servers, allowing for venting of heat out of the top or bottom of the switch. In one embodiment, the rear sidewall may comprise two or more surfaces, with at least one of the surfaces being angled. One rear surface may comprise receiving connectors while the second rear surface may be used for venting (i.e., not contain connectors).

In one embodiment, a method of mounting switches comprises using brackets of varying lengths to rack switches from the front of the cabinet, while still positioning the back of the switch substantially even with the backs of the servers mounted in the same cabinet.

In one embodiment, a method of mounting servers comprises using a plurality of sliding rails to mount one or more servers above and/or below a switch, which allows the servers to be at least partially extended out of the front of the cabinet without being completely un-mounted from the cabinet.

In one embodiment, a method of configuring a logical computing unit or "LCU" (defined as a switch, its cable management system, and all of the servers attached to the switch) comprises a first cabinet, a second cabinet, and a third cabinet, wherein the second cabinet is interposed between the first and third cabinets and comprises at least one networking switch; wherein the first and third cabinets comprise a plurality of servers and wherein the cabling from the first and third cabinets runs substantially horizontally to the second cabinet.

In one embodiment, a cabling channel, with or without an associated cable management system, is configured to extend from one cabinet to one or more adjacent cabinets so as to protect the cabling, either as part of a new cabinet design, or retrofitted to existing cabinets via modifications to the mounting rails or via hardware inserted between the cabinet post and the mounting rails.

In one embodiment, one or more cabling channels are configured in one or both of the side panels of a cabinet, either as part of a new cabinet design, or retrofitted to existing cabinets. A protective insert may be included to protect the network cables from the metal along the edges of the cabling channels.

In one embodiment, a cable management system is positioned in-line, behind a switch. This differs from the current art, where cable management systems are positioned above or below the switch. The cable management system may be mounted (1) between the cabinet and the rails, (2) directly to the cabinet, (3) directly to the switch, or (4) directly to the rails. The cable management system organizes the network cables and is also weight bearing so as to reduce the weight placed upon the network ports of the switch it services.

In one embodiment, a protective cabling channel is configured to run vertically along the cabinet for cabling running between switches. The protective cabling channel may be constructed as part of a cabinet, or may be retrofitted to existing cabinets.

BRIEF DESCRIPTION OF THE DRAWINGS

FIG. 1A illustrates a side elevation view of an 8P8C connector of the prior art;
FIG. 1B illustrates a side view of the copper pins of an 8P8C connector of the prior art;
FIG. 1C illustrates a side view of the copper pins of an 8P8C connector of the prior art;
FIG. 1D illustrates the front elevation view an 8P8C connector of the prior art;
FIG. 11 illustrates a top plan view of a switch in one embodiment;

FIG. 12 illustrates a top plan view of a switch in one embodiment;

DETAILED DESCRIPTION OF EXAMPLE EMBODIMENTS

Figure 1E:
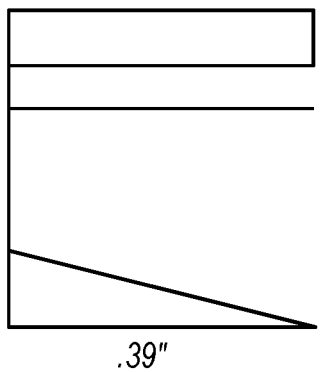
FIG. 1E illustrates a side elevation view of a female modular connector of the prior art.
Figure 1H:
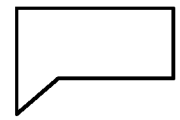
FIG. 1H illustrates a side elevation view of an insert for the 8P8C connector of the prior art.
Figure 1F:
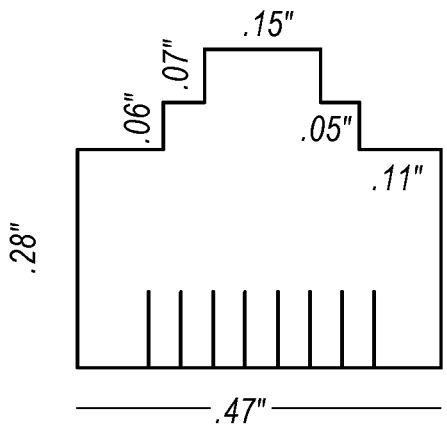
FIG. 1F illustrates a front elevation view of a female modular connector of the prior art.
Figure 1I:
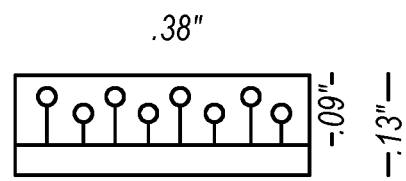
FIG. 1I illustrates a front view of an insert for the 8P8C connector of the prior art.
Figure 1G:
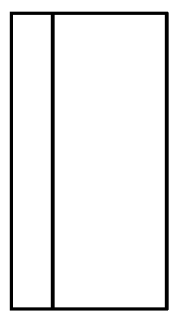
FIG. 1G illustrates a bottom plan view of an insert for the 8P8C connector of the prior art.
Figure 2A:
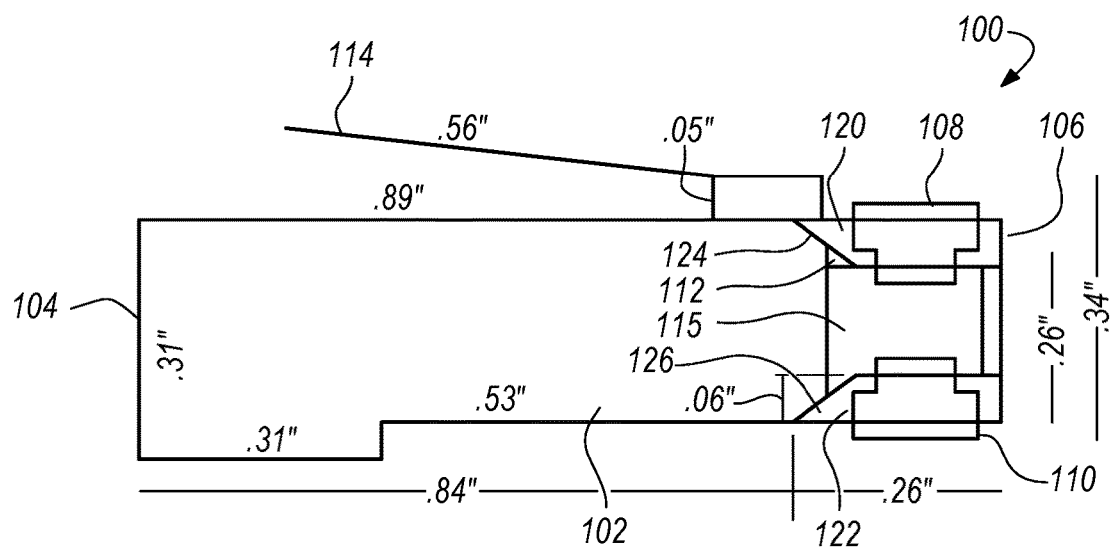
FIG. 2A illustrates a side elevation view of an 8P8C modular connector in one embodiment.
Figure 2B:
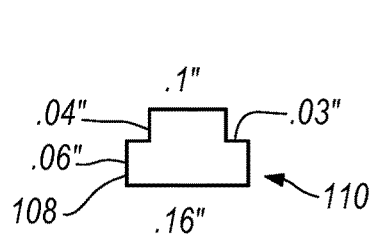
FIG. 2B illustrates a side elevation view of copper pins of an 8P8C modular connector in one embodiment.
Figure 2C:
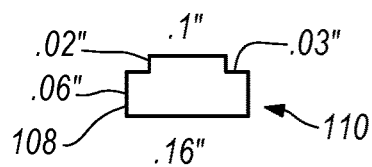
FIG. 2C illustrates a side elevation view of copper pins of an 8P8C modular connector in one embodiment.
Figure 2D:
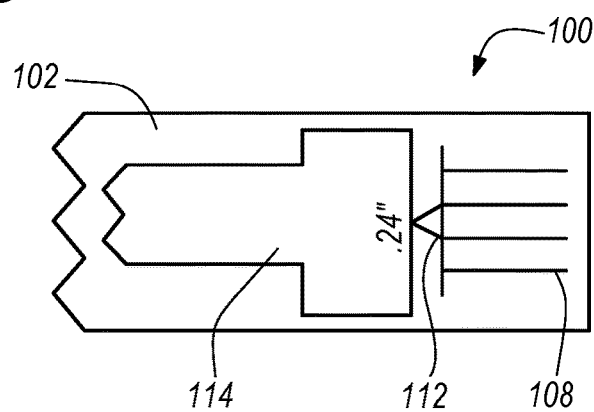
FIG. 2D illustrates a top plan view of an 8P8C modular connector in one embodiment.
Figure 2E:
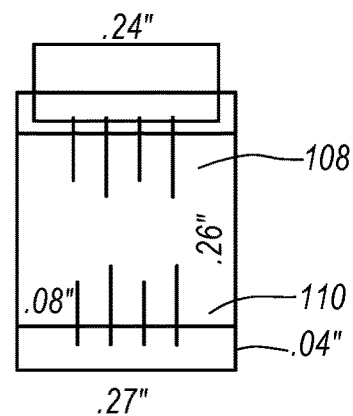
FIG. 2E illustrates a front elevation view of an 8P8C connector in one embodiment.
Figure 2F:
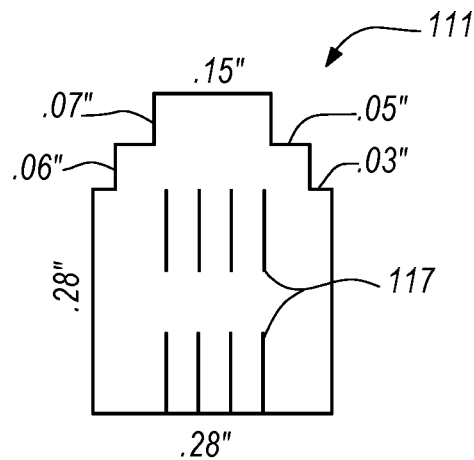
FIG. 2F illustrates a front elevation view of a female 8P8C connector in one embodiment.
Figure 2G:
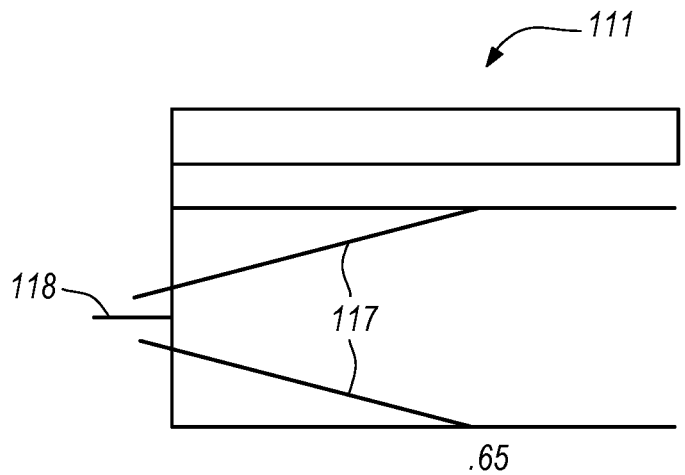
FIG. 2G illustrates a side elevation view of a female 8P8C connector in one embodiment.
Figures 2H, 2I, 2J:
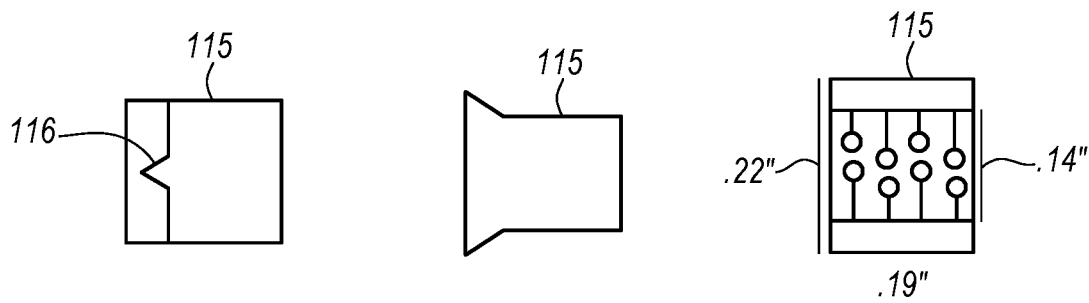
FIG. 2H illustrates a top plan view of an insert for an 8P8C connector in one embodiment.
FIG. 2I illustrates a side elevation view of an insert for an 8P8C connector in one embodiment.
FIG. 2J illustrates a front elevation view of an insert for an 8P8C connector in one embodiment.
Figure 3A:
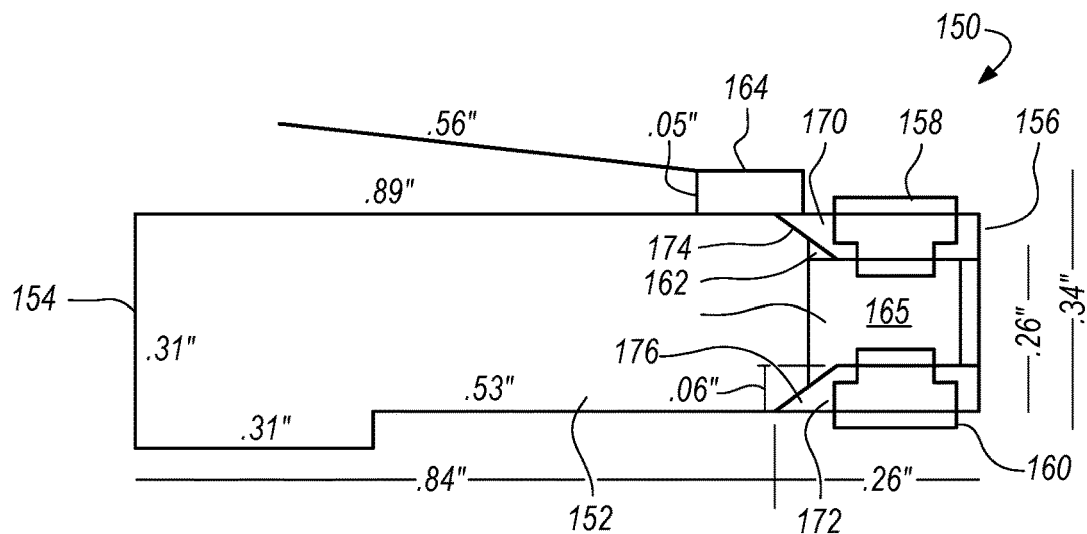
FIG. 3A illustrates a side elevation view of a 16P16C connector in one embodiment.
Figure 3B:
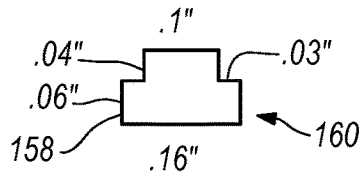
FIG. 3B illustrates a side elevation view of the copper pins of a 16P16C connector in one embodiment.
Figure 3C:
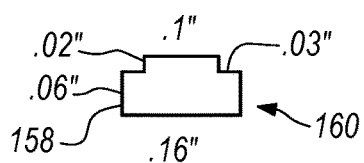
FIG. 3C illustrates a side elevation view of the copper pins of a 16P16C connector in one embodiment.
Figure 3D:
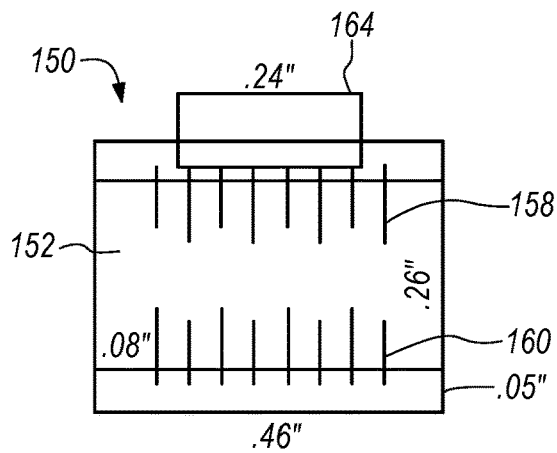
FIG. 3D illustrates a front elevation view of a 16P16C connector in one embodiment.
Figure 3E:
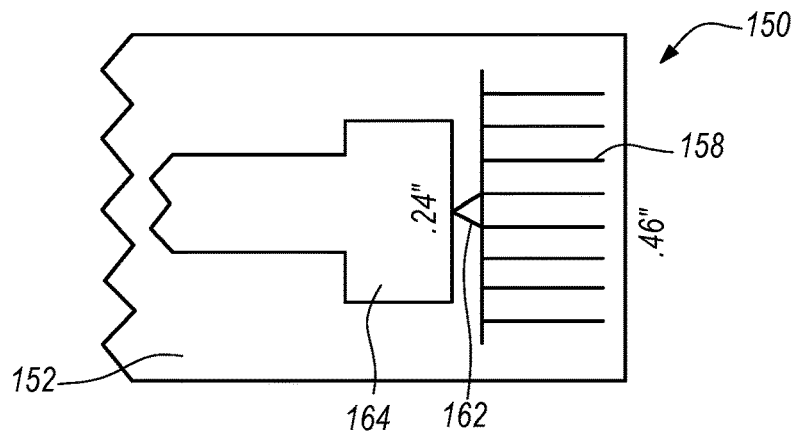
FIG. 3E illustrates a top plan view of a 16P16C connector in one embodiment.
Figure 3F:
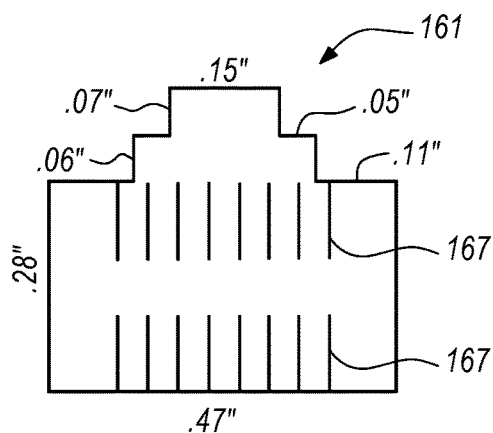
FIG. 3F illustrates a front elevation view of a female connector for a 16P16C connector in one embodiment.
Figure 3G:
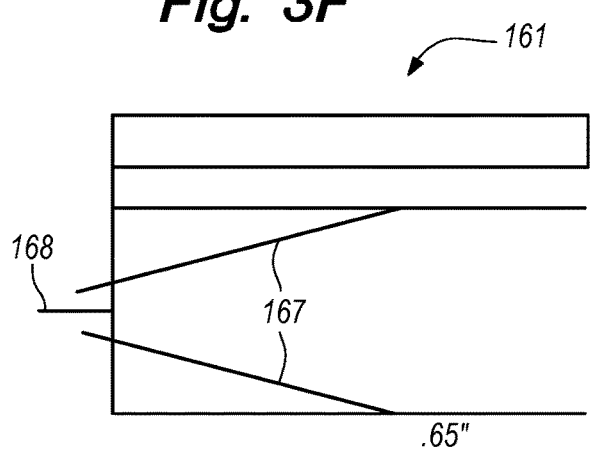
FIG. 3G illustrates a side elevation view of a female connector for a 16P16C connector in one embodiment.
Figure 3H:
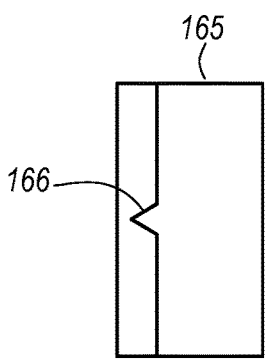
FIG. 3H illustrates a top plan view of an insert for a 16P16C connector in one embodiment.
Figure 3I:
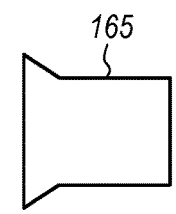
FIG. 3I illustrates a side elevation view of an insert for a 16P16C connector in one embodiment.
Figure 3J:
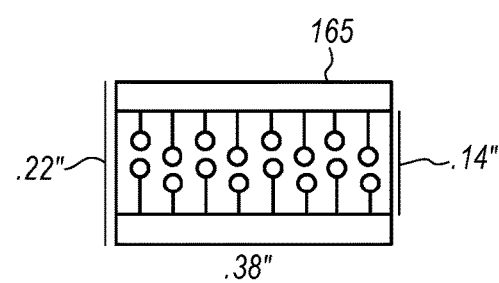
FIG. 3J illustrates a front elevation view of an insert for a 16P16C connector in one embodiment.
Figure 4A:
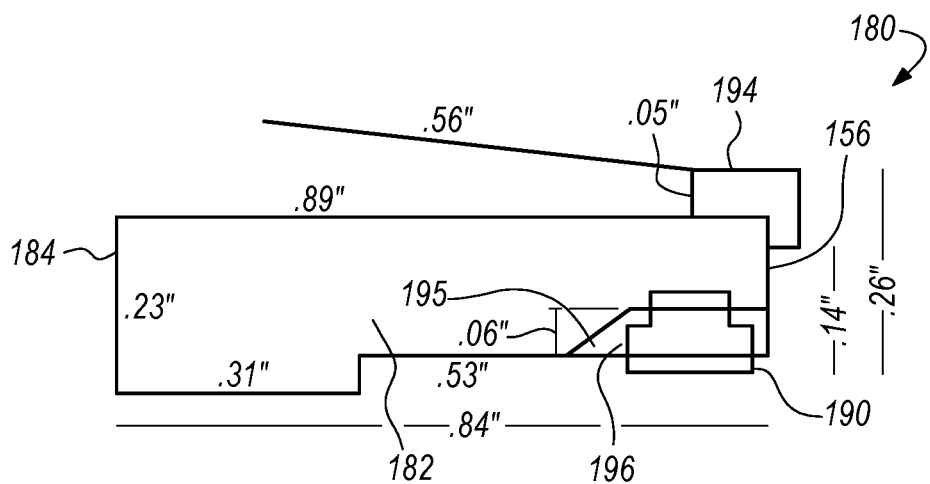
FIG. 4A illustrates a side elevation view of an 8P8C connector in one embodiment.
Figure 4B:
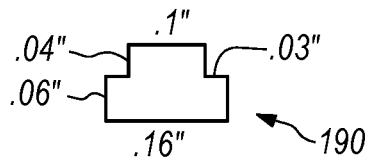
FIG. 4B illustrates a side elevation view of the copper pins of an 8P8C connector in one embodiment.
Figure 4C:
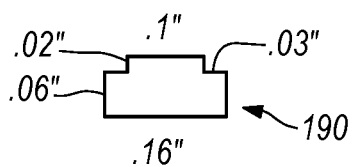
FIG. 4C illustrates a side elevation view of the copper pins of an 8P8C connector in one embodiment.
Figure 4D:
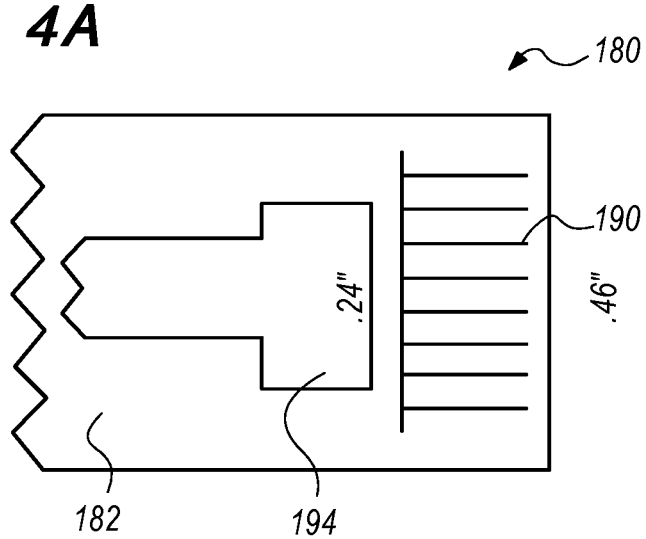
FIG. 4D illustrates a top plan view of an 8P8C connector in one embodiment.
Figure 4E:
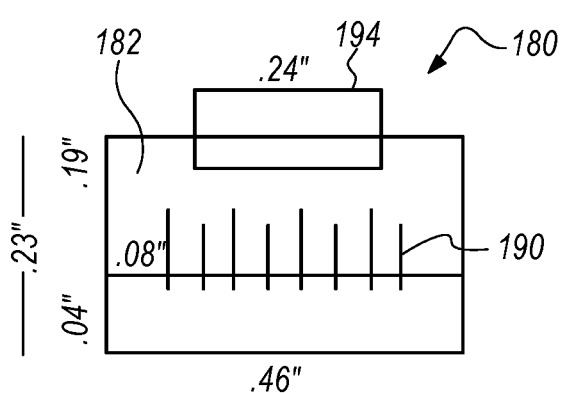
FIG. 4E illustrates a front elevation view of an 8P8C connector in one embodiment.
Figure 4F:
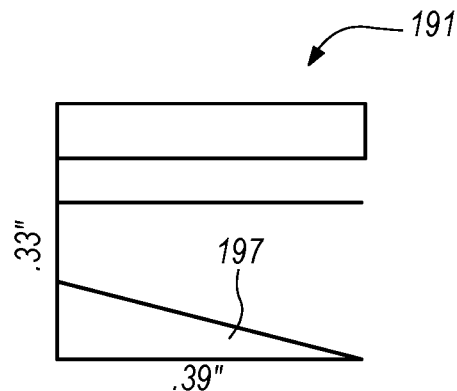
FIG. 4F illustrates a side elevation view of a female connector for an 8P8C connector in one embodiment.
Figure 4G:
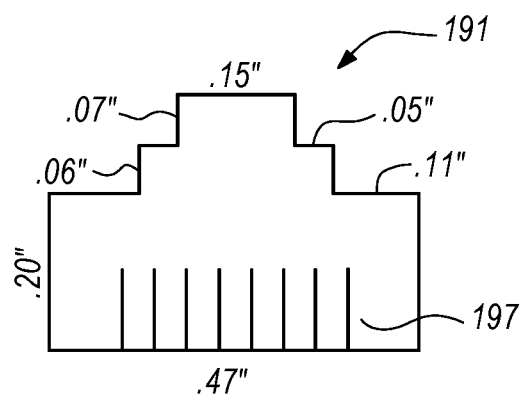
FIG. 4G illustrates a front elevation view of a female connector for an 8P8C connector in one embodiment.
Figure 4H:
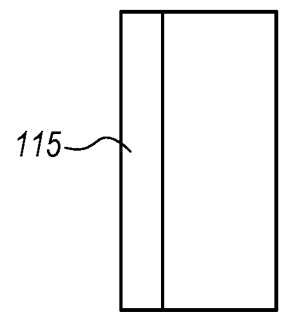
FIG. 4H illustrates a bottom plan view of the insert for an 8P8C connector in one embodiment.
Figure 4I:
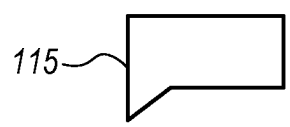
FIG. 4I illustrates a side elevation view of the female connector for an 8P8C connector in one embodiment.
Figure 4J:
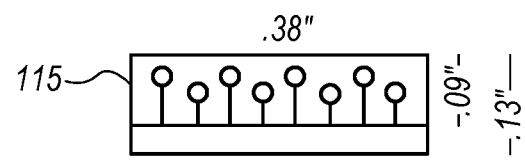
FIG. 4J illustrates a front elevation view of an insert for an 8P8C connector in one embodiment.

The following descriptions depict only example embodiments and are not to be considered limiting in scope. Any reference herein to "the invention" is not intended to restrict or limit the invention to exact features or steps of any one or more of the exemplary embodiments disclosed in the present specification. References to "one embodiment," "an embodiment," "various embodiments," and the like, may indicate that the embodiment(s) so described may include a particular feature, structure, or characteristic, but not every embodiment necessarily includes the particular feature, structure, or characteristic. Further, repeated use of the phrase "in one embodiment," or "in an embodiment," do not necessarily refer to the same embodiment, although they may.

Reference to the drawings is done throughout the disclosure using various numbers. The numbers used are for the convenience of the drafter only and the absence of numbers in an apparent sequence should not be considered limiting and does not imply that additional parts of that particular embodiment exist. Numbering patterns from one embodiment to the other need not imply that each embodiment has similar parts, although it may.

Accordingly, the particular arrangements disclosed are meant to be illustrative only and not limiting as to the scope of the invention, which is to be given the full breadth of the appended claims and any and all equivalents thereof. Although specific terms are employed herein, they are used in a generic and descriptive sense only and not for purposes of limitation. Unless otherwise expressly defined herein, such terms are intended to be given their broad, ordinary, and customary meaning not inconsistent with that applicable in the relevant industry and without restriction to any specific embodiment hereinafter described. As used herein, the article "a" is intended to include one or more items. When used herein to join a list of items, the term "or" denotes at least one of the items, but does not exclude a plurality of items of the list. For exemplary methods or processes, the sequence and/or arrangement of steps described herein are illustrative and not restrictive.

It should be understood that the steps of any such processes or methods are not limited to being carried out in any particular sequence, arrangement, or with any particular graphics or interface. Indeed, the steps of the disclosed processes or methods generally may be carried out in various sequences and arrangements while still falling within the scope of the present invention.

The term "coupled" may mean that two or more elements are in direct physical contact. However, "coupled" may also mean that two or more elements are not in direct contact with each other, but yet still cooperate or interact with each other.

The terms "comprising," "including," "having," and the like, as used with respect to embodiments, are synonymous, and are generally intended as "open" terms (e.g., the term "including" should be interpreted as "including, but not limited to," the term "having" should be interpreted as "having at least," the term "includes" should be interpreted as "includes, but is not limited to," etc.).

As previously discussed, there remains a need for a modular connector (e.g., an 8P8C or "RJ45" connector used for LAN connections) that is smaller in size, thereby allowing more connection ports in a given space. As used herein, a male modular connector terminates a cable and allows for electrical connections. Modular connectors have a variety of sizes and contacts (e.g. 4P4C, 6P6C, 8P8C, etc.). As used herein, the term "modular connector" alone may refer to either a male or female component. While 8P8C and 16P16C connectors are used as examples herein, the invention is not so limited and may be used with other modular connectors.

Further, there is a need for a switch configured to have more connection ports without wasting additional cabinet space. Even further is the need of the cabinet or cabinets to be arranged in a manner that increases efficiency, allows heat dissipation, saves cabling costs, and that reduces or eliminates damage to connection ports due to hanging cables. The modular connectors, network switch, and system and method of racking and cabling the switch and servers in a cabinet disclosed herein solve these and other problems.

FIGS. 1A-1I illustrate a modular connector (e.g., 8P8C modular connector used for Ethernet) of the prior art. The 8P8C modular connector in the art is standardized according to International Standard IEC 60603. Accordingly, the present disclosure deviates from the IEC 60603 standards in height, configuration and width in order to accommodate a greater number of connections. Therefore, referring to FIGS. 2A-2J a modular connector (8P8C) is shown. As shown, in one embodiment, a male modular connector 100 (may also be referred to as a "plug" or "8P8C plug") comprises a housing 102 having a cable receiving end 104 and a coupling end 106, wherein the coupling end 106 comprises a first set of electrical contacts 108 on a first (e.g., top) side and a second set of electrical contacts 110 on an opposite, second (e.g., bottom) side. It will be appreciated that while the electrical contacts 108 are discussed as being on a top and bottom side, other configurations would be possible, such as electrical contacts positioned on one or more vertical sides. In one example, the electrical contacts 108, 110 may be copper pins or other conductive material. The electrical contacts 108, 110 are held in place by sections of the housing 120 and 122 which form ramps 124 and 126 along the interior of the housing 102. A wire insert 115 may be used to position the copper wires from the networking cable in the appropriate location in relation to the electrical contacts 108 and 110. The wire insert 115 is guided into place by the ramps 124 and 126. A keyed portion 112 (or other orienting feature) fits with the indention 116 on the wire insert 115 to ensure correct coupling as it is inserted into the housing 102. It will be appreciated that while a keyed protrusion 112 is used in the example above, a keyed portion is not required. In one embodiment, the male modular connector 100 may also, or in the alternative, be configured to crimp the wires, thereby prohibiting lateral and longitudinal movement of the wires and cable, as known in the art.

The electrical contacts 108, 110 are exposed on the top and bottom sides of the housing 102, and couple with a female modular connector 111 containing multiple sets of electrical contacts 117 designed to complete electrical circuits with the electrical contacts 108, 110 of the 8P8C plug 100. A non-conductive shield 118 is placed along the back of the female modular connector 111 to ensure that the electrical contacts 117 on opposite sides of the female modular connector 111 don't make electrical contact with each other. A retaining clip 114 may be used so as to prevent unwanted withdrawal of the male modular connector 100 from the female modular connector 111. The retaining clip 114 is shifted farther back along the body of the housing 102 to expose the pins 108. The front of the retaining clip 114 also ensures correct orientation of the modular plug 100 as it is inserted into the female modular connector 111. The body of the housing 102 and the female modular connector 111 are both elongated (i.e., lengthened in comparison to those in the prior art and the IEC 60603 standard) to accommodate the new position of the retaining clip 114. By comparing FIGS. 1A-1I and FIGS. 2A-2J, it is appreciated that the width of the male modular connector 100 is just over half that of the standard 8P8C plug in the art and IEC standard. In one embodiment, the housing 102 is at least 20% narrower than an 8P8C plug in the art (FIG. 1A). In one embodiment, the housing 102 is at least 40% narrower than 8P8C plug in the art (FIG. 1A). While the Figs. herein illustrate dimensions of the invention, it will be appreciated that the invention is not limited to those dimensions, and that other dimensions are possible.

The smaller/narrower configuration of the modular connector provides for several benefits, the primary of which is the ability to have additional connection ports on a device. In other words, a standard network switch may have forty-eight ports (i.e., female receiving connectors/jacks). By utilizing the male modular connector 100 and female receiving connector 111, the same switch could house eighty connectors. This is a dramatic increase to the usable space within a cabinet, allowing for companies to reduce the amount of space dedicated to switching infrastructure inside their data center, thereby allowing them to provision more servers without having to increase the size of their datacenter, thereby reducing the overall cost of the data center. As a secondary benefit, to the extent that the male modular connector 100 reduces the necessary surface area dedicated to female modular connectors 111, some of the freed-up surface area can be dedicated to additional screens to improve the switch's ability to vent waste heat. Unlike prior attempts to make smaller ethernet connections, such as the '422 patent to Yuen, the presently-disclosed modular connectors allow a technician to quickly and easily make custom-length cables by easily cutting the cable to length and crimping new modular plugs on the cables. Accordingly, the present invention overcomes limitations in the prior art.

FIGS. 3A-3J illustrate a 16P16C connector. As shown, in one embodiment, a 16P16C plug 150 comprises a housing 152 having a cable receiving end 154 and a coupling end 156, wherein the coupling end 156 comprises a first set of electrical contacts 158 on a top side and a second set of electrical contacts 160 on an opposite, bottom side. It will be appreciated that while the electrical contacts are discussed as being on a top and bottom side, other configurations would be possible, such as electrical contacts positioned on one or more sides. The electrical contacts 158, 160 are held in place by sections of the housing 170 and 172 which form ramps 174 and 176 along the interior of the housing 152. A wire insert 165 may be used to position the copper wires from the networking cable in the appropriate location in relation to the electrical contacts 158 and 160. The wire insert 165 is guided into place by the ramps 174 and 176. A keyed portion 162 (or other orienting feature) fits with the indention 166 on the wire insert 165 to ensure correct coupling as it is inserted into the plug 150. The plug 150 may also, or in the alternative, be configured to crimp the wires, thereby prohibiting lateral and longitudinal movement of the wires and cable, as known in the art. The electrical contacts 158, 160 are exposed on the top and bottom sides of the housing 152, and couple with a female modular connector 161 containing multiple sets of electrical contacts 167 designed to complete electrical circuits with the electrical contacts of the plug 150. A non-conductive shield 168 is placed along the back of the female housing 161 to ensure that the electrical contacts 167 on opposite sides of the female modular connector 161 don't make electrical contact with each other. A retaining clip 164 may be used so as to prevent unwanted withdrawal of the 16P16C plug 150 from the female receiving modular connector 161. The retaining clip 164 is shifted farther back along the body of the housing 152 to expose the pins 158. The retaining clip 164 also ensures correct orientation of the plug 150 as it is inserted into the female modular connector 161. The housing 152 and the female modular connector 161 are both lengthened (in relation to connectors currently in the art (e.g., FIGS. 1A-1I)) to accommodate the new position of the retaining clip 164. By comparing FIG. 1A and FIG. 3A, it is appreciated that the width of the 16P16C plug 150 is the same as that of the standard 8P8C connector in the art (IEC standard), but there are twice as many electrical contacts in plug 150. This configuration provides for significant benefits in that a single cable and a single networking port (i.e., female receiving connectors) can transmit twice as much data as the standard 8P8C connector.

FIGS. 4A-4J illustrate another embodiment of an 8P8C connector. As shown, in one embodiment, an 8P8C plug 180 comprises a housing 182 having a cable receiving end 184 and a coupling end 186, wherein the coupling end 186 comprises a shorter set of electrical contacts 190 on the bottom side of the housing 182. The housing 182 contains a shorter ramp 195. The shorter electrical contacts 190 are exposed, and couple with a female receiving connector 191 containing electrical contacts 197 designed to complete electrical circuits with the electrical contacts 190. A retaining clip 194 may be used so as to prevent unwanted withdrawal of the 8P8C plug 180 from the female receiving connector 191. The retaining clip 194 also ensures correct orientation of the connector 180 as it is inserted into the female connector 191. The housing 182 and the female connector 191 are both shortened along the vertical axis as a result of the shortened electrical contacts 190 and the changes to the ramp 195 and the section 196 of the housing 182 in which the electrical contacts 190 are mounted. By comparing FIGS. 1A-1I and FIGS. 4A-4J, it is appreciated that while the width of the 8P8C connector, and the amount of data able to be transmitted are unchanged, the height of the 8P8C plug 180 is reduced. In one embodiment, the electrical contacts 190 are at least 30% shorter than the electrical contacts (FIGS. 1B-1C) of a standard 8P8C plug.

This configuration requires less overall surface area for each network port (i.e., female receiving connectors). By utilizing the 8P8C plug 180 and female receiving connector 191, surface area on the back face of a switch is freed up, and that additional space can be dedicated to additional features designed to improve the switch's ability to vent waste heat, among other things. It will be appreciated that while 8P8C and 16P16C connectors are used as examples throughout, they are non-limiting in scope and other configurations (e.g., 10P10C) and form-factors are possible. Accordingly, such modifications do not depart herefrom and are within the scope of this invention.

Figure 5:
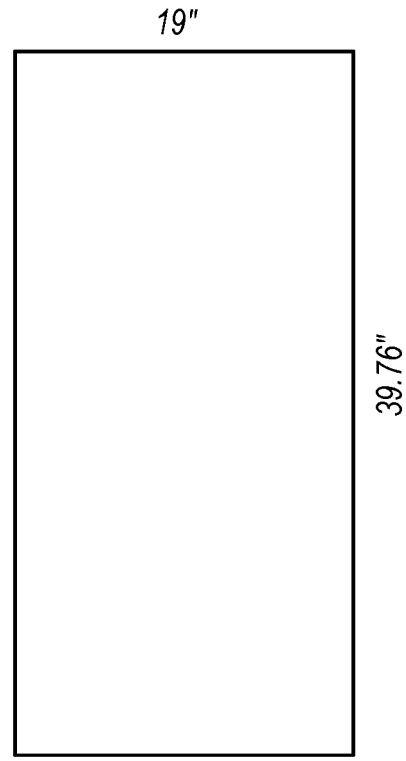
FIG. 5 illustrates a top plan view of a standard data cabinet of the prior art.
Figure 6:
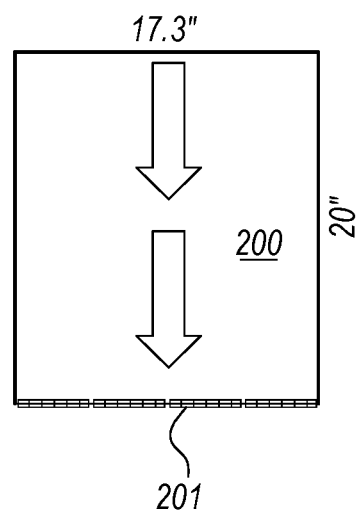
FIG. 6 illustrates a top plan view of a switch of the prior art.
Figure 7A:
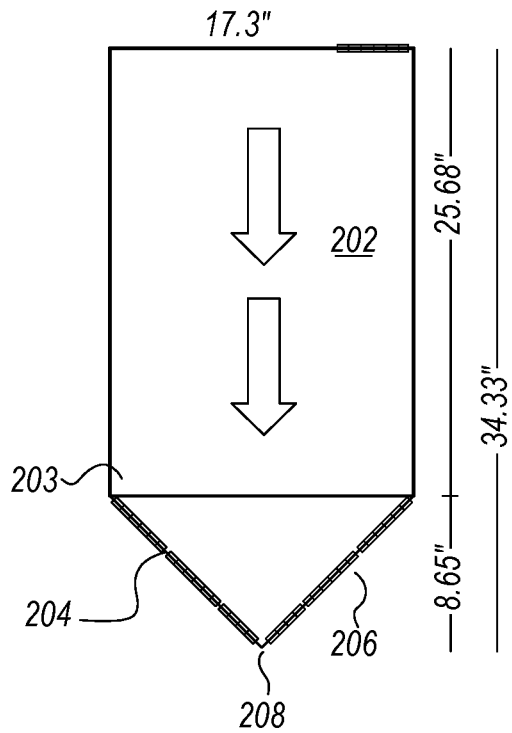
FIG. 7A illustrates a top plan view of a switch in one embodiment.
Figure 7B:
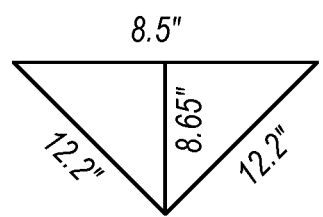
FIG. 7B illustrates the dimensions of the back of a switch in one embodiment.
Figure 8:
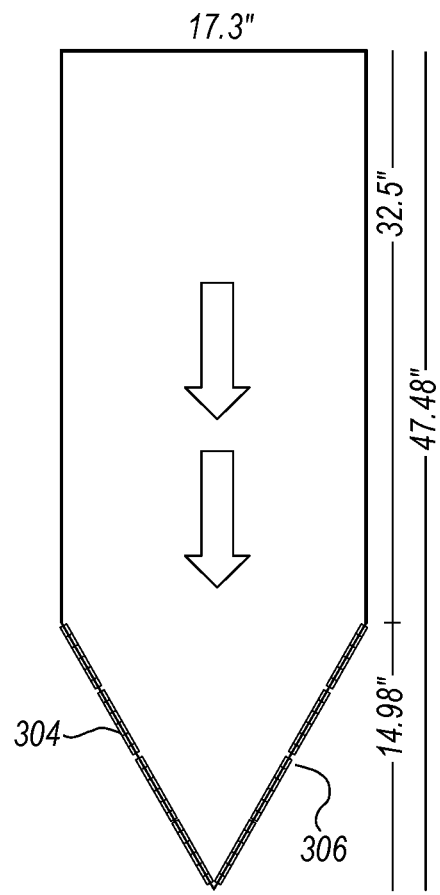
FIG. 8 illustrates a top plan view of a switch in one embodiment.
Figure 9:
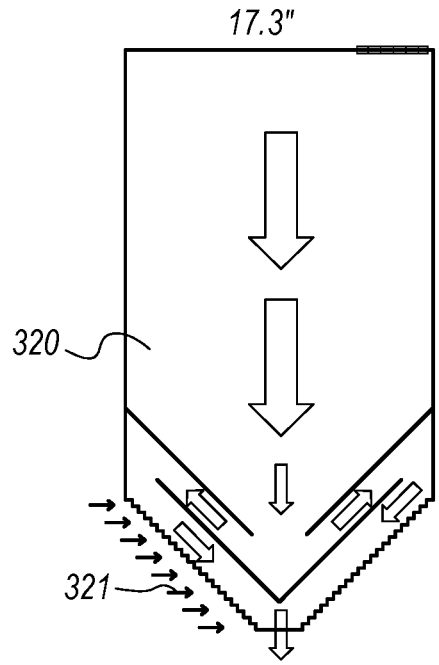
FIG. 9 illustrates a top plan view of a switch in one embodiment.

FIG. 5. illustrates a top view of a current data center cabinet in the art. FIG. 6 illustrates a switch 200 of the prior art, having a back side 201 (connection port side) perpendicular to the walls of the cabinet. In one embodiment, as shown in FIGS. 7A-7B, a network switch 202 comprises a housing 203, non-cuboidal in shape, with the rear side comprising two sections 204, 206 that are not perpendicular to the cabinet walls such that an apex 208 is formed; each rear side 204, 206 comprising a plurality of network ports (e.g., female receiving connectors 111, 161, 191, or other network port). In such an arrangement, it is possible to significantly increase the amount of ports on a switch (e.g., from forty-eight ports to seventy-two ports). FIG. 7B illustrates non-limiting dimensions for the rear (triangular) side 204, 206. As shown in FIG. 8, by utilizing elongated rear sections 304, 306, to have greater surface area, even more ports may be added (e.g., a total of 96 ports). As understood herein, "ports" refers to the female receiver of a modular connector in the art, the 8P8C connector 111 disclosed herein, or other network connector. In one embodiment, as shown in FIG. 9, a switch 320 comprises network ports 321 set parallel to the sides of the cabinet and an apex 322 that allows for heat exhaustion. It will be appreciated that the ports 321 may face the sides of the cabinet, as shown, but may, in the alternative, be perpendicular (or some angle between parallel and perpendicular) to the cabinet sides. As shown, the apex 322 may be flat and not contain any ports, so as to aid in the venting of waste heat. Having the ports parallel to the sides of the cabinet, rather than parallel to the back faceplates, simplifies cable management in association with the non-standard angle of the back faceplates.

Figure 10A:
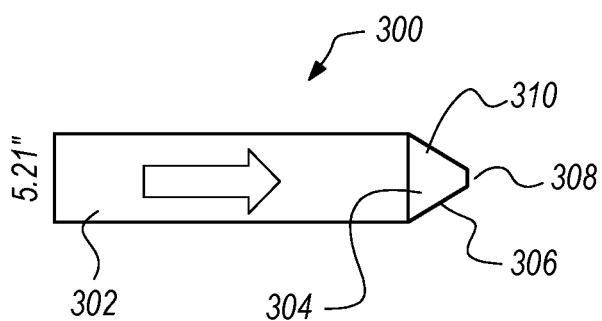
FIG. 10A illustrates a side elevation view of a switch in one embodiment.
Figure 10B:
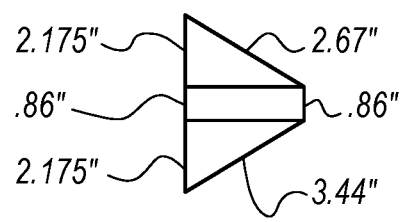
FIG. 10B illustrates the dimensions of the back side of a switch in one embodiment.

In one embodiment, as shown in FIGS. 10A-10B, a network switch 300 comprises a non-cuboidal housing 302 wherein each rear side 304 (only one side visible in this Figure, but see FIGS. 6-9 for examples of rear sides) comprises three surface areas 306, 308, 310, each surface area 306, 308, 310 comprising a plurality of network receiving connectors, such as the 8P8C female receiving connectors 111, 161, or 191 disclosed herein. For example, surface areas 306 and 310 may have 96 ports each, with surface area 308 comprising 24 ports. In other words, using such a configuration, it is possible to have over two-hundred ports on a single switch. In one embodiment, one or more surface areas 306, 308, 310 may be used for heat exhaust, as opposed to having connecting ports.

Figure 13:
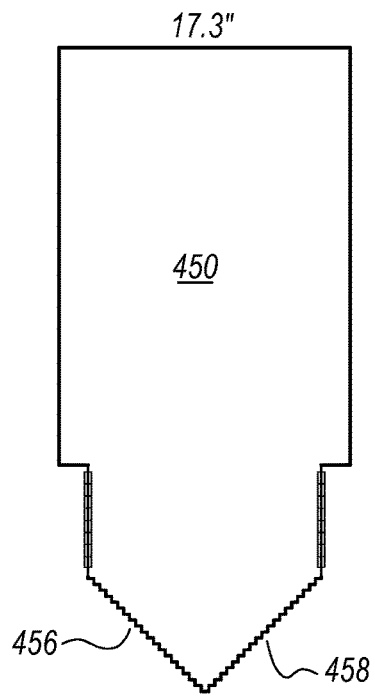
FIG. 13 illustrates a top plan view of a switch in one embodiment.

In one embodiment, as shown in FIG. 11, a network switch 400 comprises a non-cuboidal housing 402 with a back side 403 comprising a plurality of ports (female receiving connectors); connection sidewalls 410, 412 are inset from sides 414 and 416, connecting the sides 414 and 416 to the back 403. Connection sidewalls 410 and 412 further comprise a plurality of ports. As shown, the connection sidewalls 410, 412 are substantially parallel to the rails of a cabinet when racked and are spaced sufficiently from the rails to allow a male connector (e.g., 8P8C connector 100, 16P16C connector 150, or other network connector) to be inserted in to the female receiving connectors. The mounting sidewalls 414, 416 run a length to the front face 418. In another embodiment, as shown in FIG. 12, a network switch 430 comprises a non-cuboidal housing 432, with an apex angle 434 at the rear; each rear side 436, 438 comprising a plurality of ports; connection sidewalls 440, 442 extend from each rear side 436, 438, respectively, and further comprise a plurality of ports. As shown, the connection sidewalls 440, 442 are substantially parallel to the rails of a cabinet when racked and are spaced sufficiently from the rails (e.g., indented) to allow a male connector (e.g., 8P8C connector 100, 16P16C connector 150, or other network connector) to be inserted into the female receiving connectors. The mounting sidewalls 444, 446 run a length to the front face 448. In another embodiment, as shown in FIG. 13, the network switch 450 shown in FIG. 12 is modified so that some or all of the network ports (female receiving connectors) along the back sides 456 and 458 of the switch 450 are oriented substantially parallel to the rails of the cabinet, allowing the male connectors to be plugged into the female receiving connectors from a direction perpendicular to the rails of the cabinet.

Figure 14:
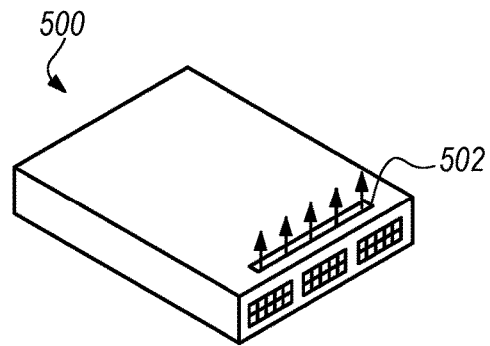
FIG. 14 illustrates a perspective view of a switch in one embodiment.
Figure 15:
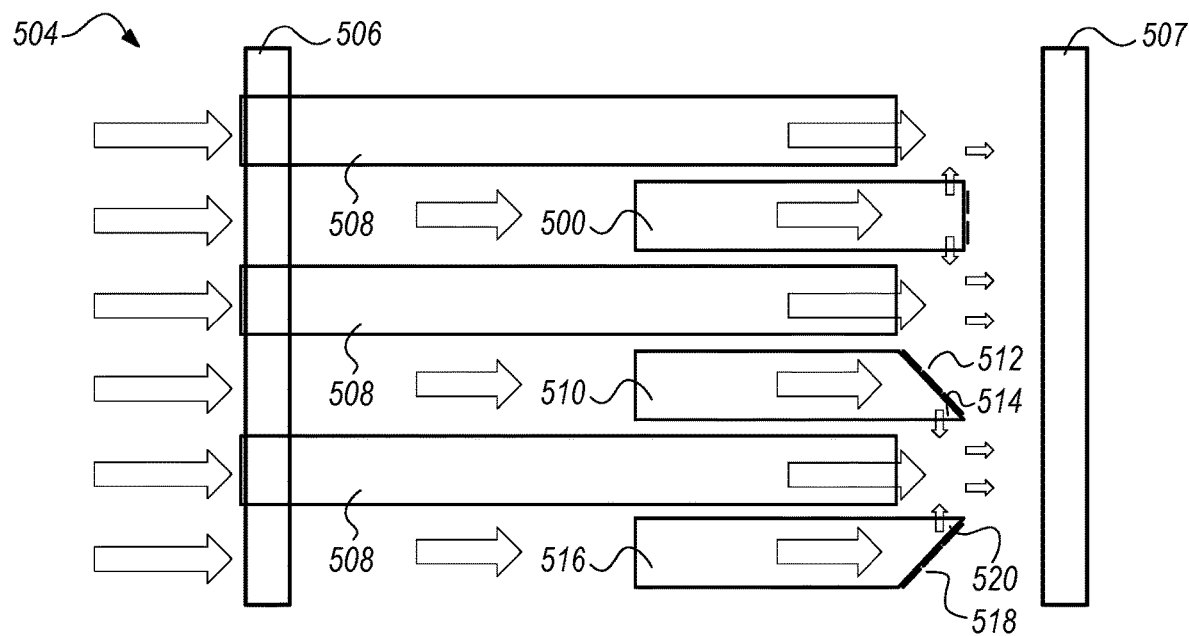
FIG. 15 illustrates a side elevation view of switches and servers in a rack in one embodiment.

In one embodiment, as shown in FIG. 14, the top surface 502 along the back of the switch 500 contains venting features that allow additional waste heat to escape in place of, or in addition to, the heat able to be vented through the back face of the switch 500. The switch 500 is shown in FIG. 15 mounted in a cabinet 504 containing posts 506 and 507 to which rails running horizontally from front to back are mounted (rails omitted for clarity sake). Servers 508 are mounted to the cabinet 504 from the front of the cabinet via rails. In one embodiment shown in FIG. 15, switch 500 is mounted so that the back of the switch 500 protrudes past the back of the servers 508, allowing air to be vented out the top and bottom of the switch 500. In another embodiment, the switch 510 contains a downward-angled back face 512 which increases the surface area of the back face 512. The switch 510 is racked with the back extending out beyond the surrounding servers 508. Waste heat is vented downward out of the bottom 514 of the switch 510, while the back face 512 of the switch 510 contains a plurality of network ports (female receiving connectors) along with the potential of additional waste-heat venting features. In another embodiment, the switch 516 is positioned with a back face 518 that is angled upwards extending beyond the surrounding servers 508. Waste heat is vented upwards through the top 520 of the switch 516 via features (e.g., screen-covered aperture) that allow the passage of air with minimal resistance. The angled back face 518 provides increased surface area both for network ports (female receiving connectors) and for venting of additional waste heat. As appreciated from the foregoing, it will be understood that vents (e.g., apertures and screens) may be included in a variety of locations on the switch to accommodate venting of waste heat.

Figure 16A:
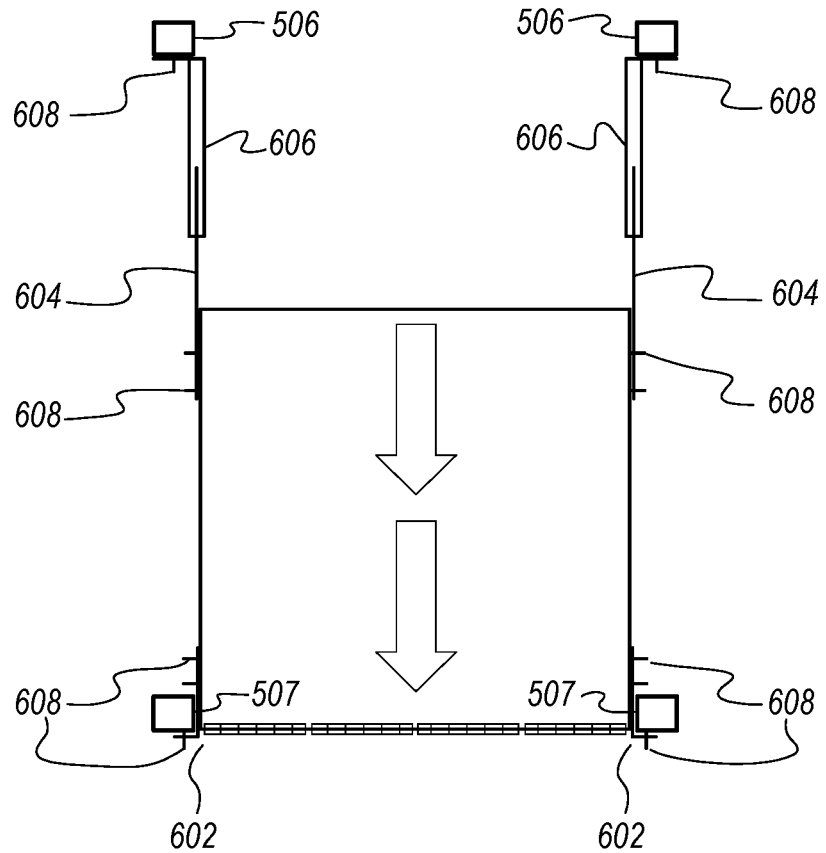
FIG. 16A illustrates a top plan view of a switch and cabinet brackets of the prior art.
Figure 16B:
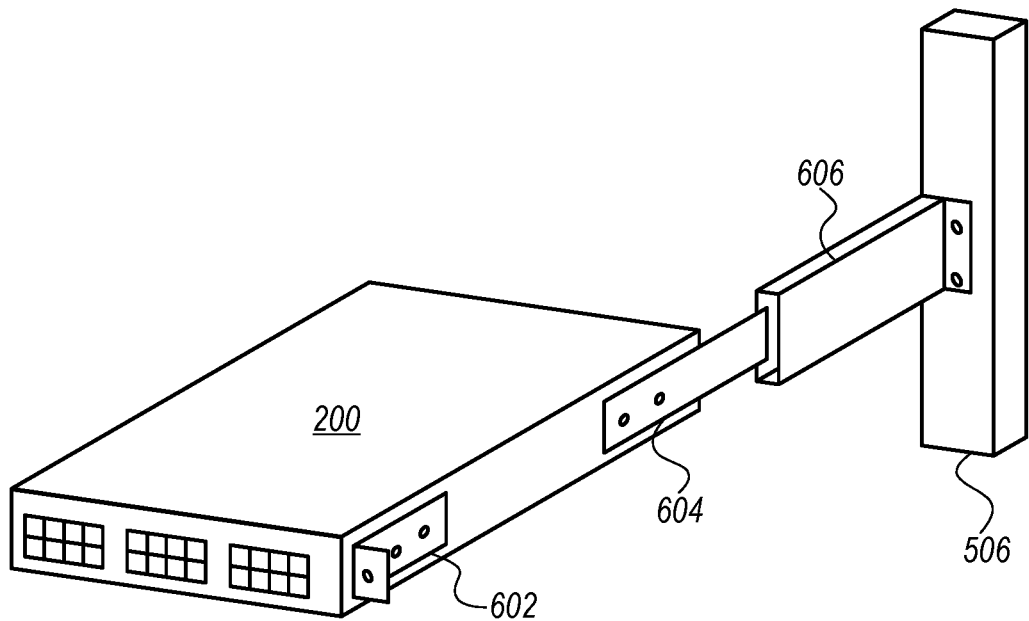
FIG. 16B illustrates a perspective view of a switch and cabinet brackets of the prior art.
Figure 16C:
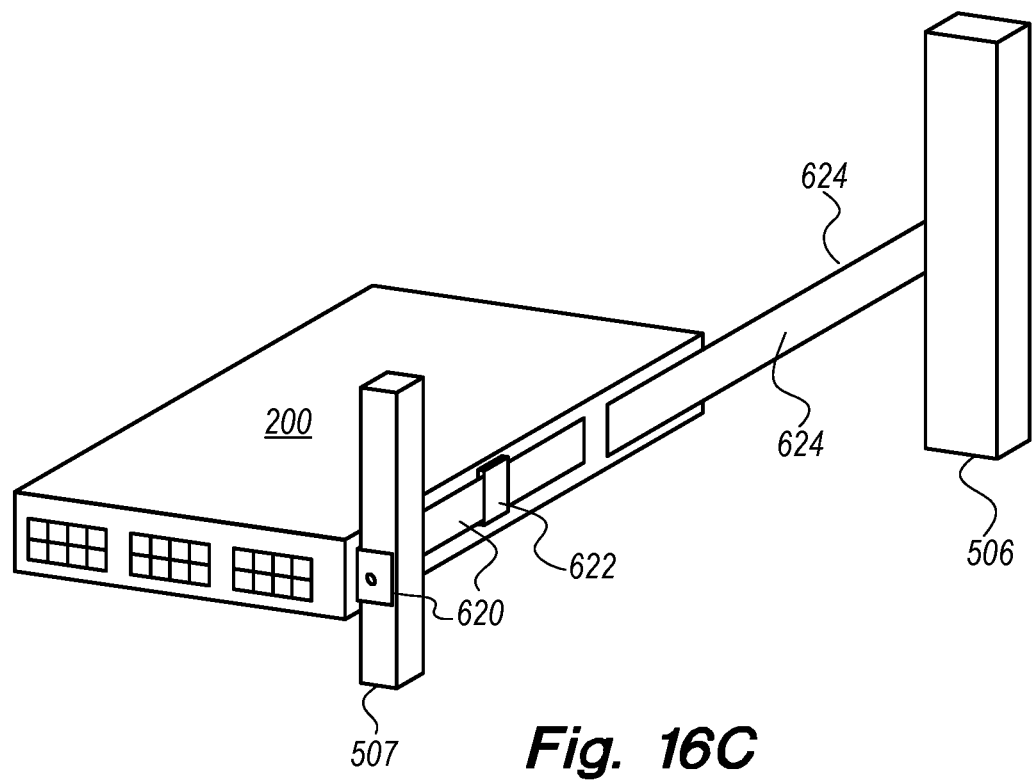
FIG. 16C illustrates a perspective view of a switch and cabinet rack configuration in one embodiment.
Figure 16D:
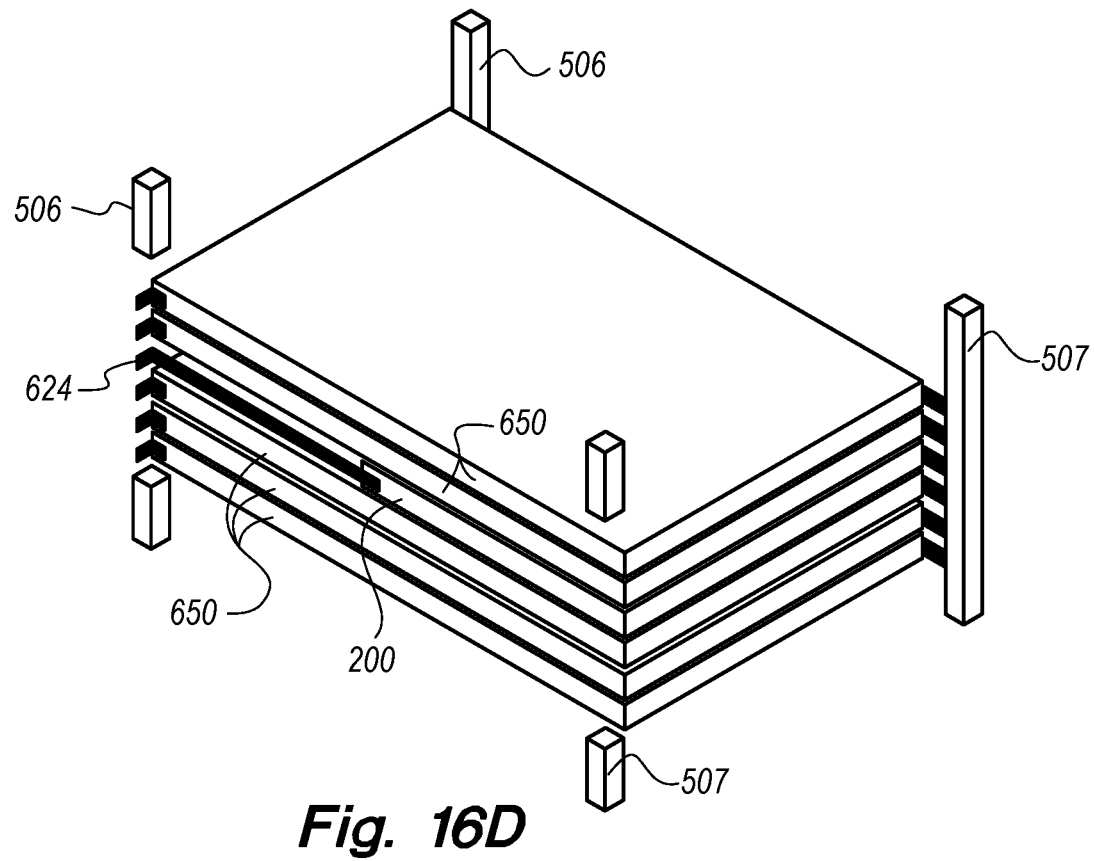
FIG. 16D illustrates a perspective view of a rack configuration in one embodiment.
Figure 16E:
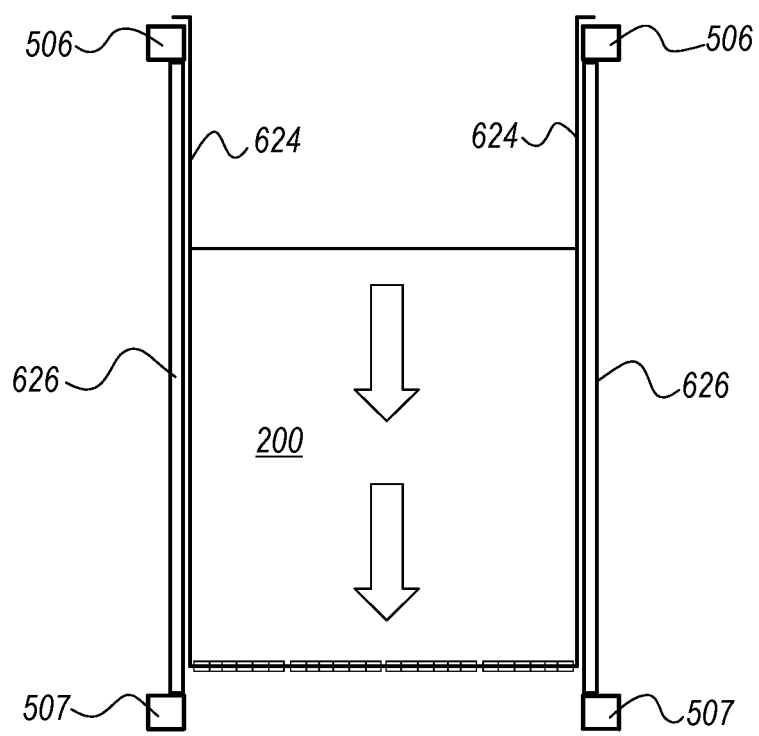
FIG. 16E illustrates a top plan view of a switch and rack configuration in one embodiment.

The current method for racking switches is shown in FIGS. 16A and 16B. The switch 200 (or other switch commonly used in the art) is equipped with mounting brackets 602, 604, and 606. The back brackets 602 are mounted to the switch 200 using fasteners 608. The front brackets 604 are likewise mounted to the switch 200 via fasteners 608. The final set of brackets 606 are fastened to the front posts 506 of the cabinet using fasteners 608. Once all of the brackets 602, 604, and 606 have been fastened, the switch 200 is racked in the cabinet from the back. The brackets 604 are inserted into the brackets 606, supporting the front of the switch 200, and the brackets 602 are fastened to the back posts 507 of the cabinet. As discussed previously, this method of racking switches creates a powerful disincentive for positioning switches in any configuration other than at the top of the cabinet. In spite of the previously enumerated savings in cabling costs, replacing faulty switches racked in a center position (horizontally in the cabinet) from the back of the cabinet requires moving network cables and power distribution units and is therefore a much more costly undertaking than replacing a switch positioned at the top of a rack. An improvement to the current art of racking switches can be seen in FIGS. 16C to 16E. In one embodiment, as shown in FIG. 16C, a mounting bracket 620 is fastened to post 507 on the back of the cabinet. A bracket 622 that is designed to fit over, or inside, the first bracket 620 is fastened to the side of the switch 200. A third bracket 624 is mounted to the switch 200 and then fastened to the front cabinet post 506 from the front of the cabinet. FIG. 16D shows the same embodiment of a switch 200 being racked from the front of cabinet using a bracket 624 which attaches to the front posts 506 of the cabinet and the switch 200. The rest of the mounting brackets 620 and 622 are omitted, but the switch 200 is shown in relation to the servers 650 racked in the same cabinet. In this embodiment, the bracket 624 is of an appropriate length to position the back of the switch 200 flush with the backs of the servers 650 (as shown in FIG. 16D) above and below the switch 200, but other configurations involving the back of the switch 200 protruding past the backs of the servers 650 or being positioned ahead of the backs of the servers 650 are also possible (part of the posts 506, 507 has been omitted for ease of illustration and to provide clarity). While switch 200 is used as an example, any switch, including those described elsewhere herein, may be used. Another embodiment is displayed in FIG. 16E. Rails 626, which are substantially similar to those used when racking servers 650, are fastened between posts 506 and 507. A bracket 624 is fastened to the front or the sides of the switch 200. The switch 200 is then slid into the rails from the front of the cabinet with the back of the switch substantially even with the backs of any servers 650 in the rack. Racking the switch from the front of the rack has several benefits, including, but not limited to, the ability of a user to remove and/or replace the switch in the cabinet without unnecessarily re-routing data or power cables, moving power distribution units, or otherwise unplugging other components, such as other switches or servers. In other words, the user would approach the rear of the cabinet and unplug the power and network cables from the rear of the switch. With the switch unplugged, the user would then approach the front of the cabinet to easily extract the switch. In this manner, other cables (whether power or network) do not need to be unplugged from other components for the removal of the switch from the front—which often must occur when attempting to remove the switch from the rear. If other components must be unplugged, downtime and unnecessary losses occur. Therefore, racking the switch from the front of the cabinet is a major improvement over the art due to the fact that it allows companies to position switches in the middle of the cabinet, or more specifically, in the middle of the servers to which the switch is connected, with all of the aforementioned benefits of doing so. Namely, cables would, on average, be one-fourth of the height of the aggregate vertical height of the switch's servers, rather than one-half the aggregate vertical height of all of the servers in the cabinet, plus the length needed to get from the port on the server over to the side of the cabinet, and then over from the side of the cabinet to the relevant port on the switch. This represents a significant savings with regards to the cost of the copper or fiber optic cabling being run from the servers to the switches. It also means that there would be two smaller bundles of cables, rather than one larger bundle of cables. The smaller bundles would take up one-fourth of the space and potentially improve the flow of cooling air through the cabinet. Further, the shorter cables reduce the potential damage to the ports and/or connectors, as the weight from the cables is significantly less. These benefits are enabled by mounting switches from the front with lengthened brackets, and this is accomplished while still being able to remove switches with the same ease traditionally experienced via positioning switches at the top of the cabinet.

Figure 17A:
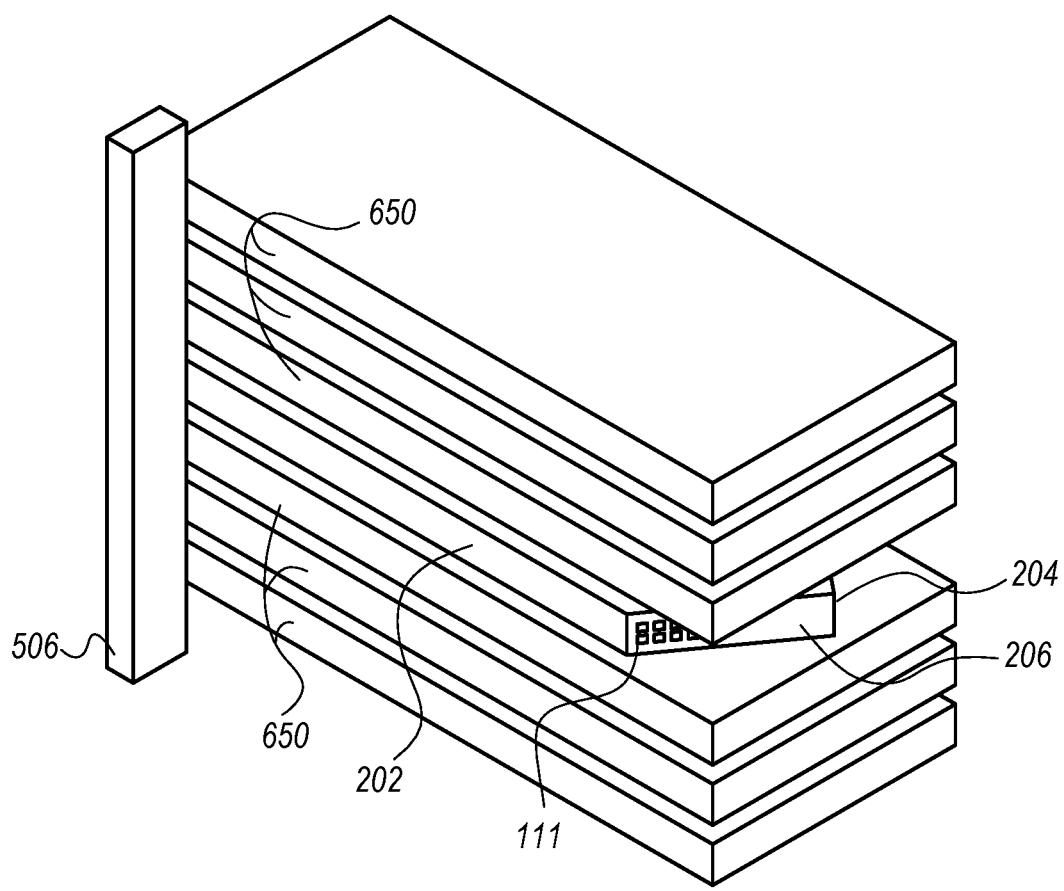
FIG. 17A illustrates a perspective view of servers and switch configuration in a cabinet of the prior art.
Figure 17B:
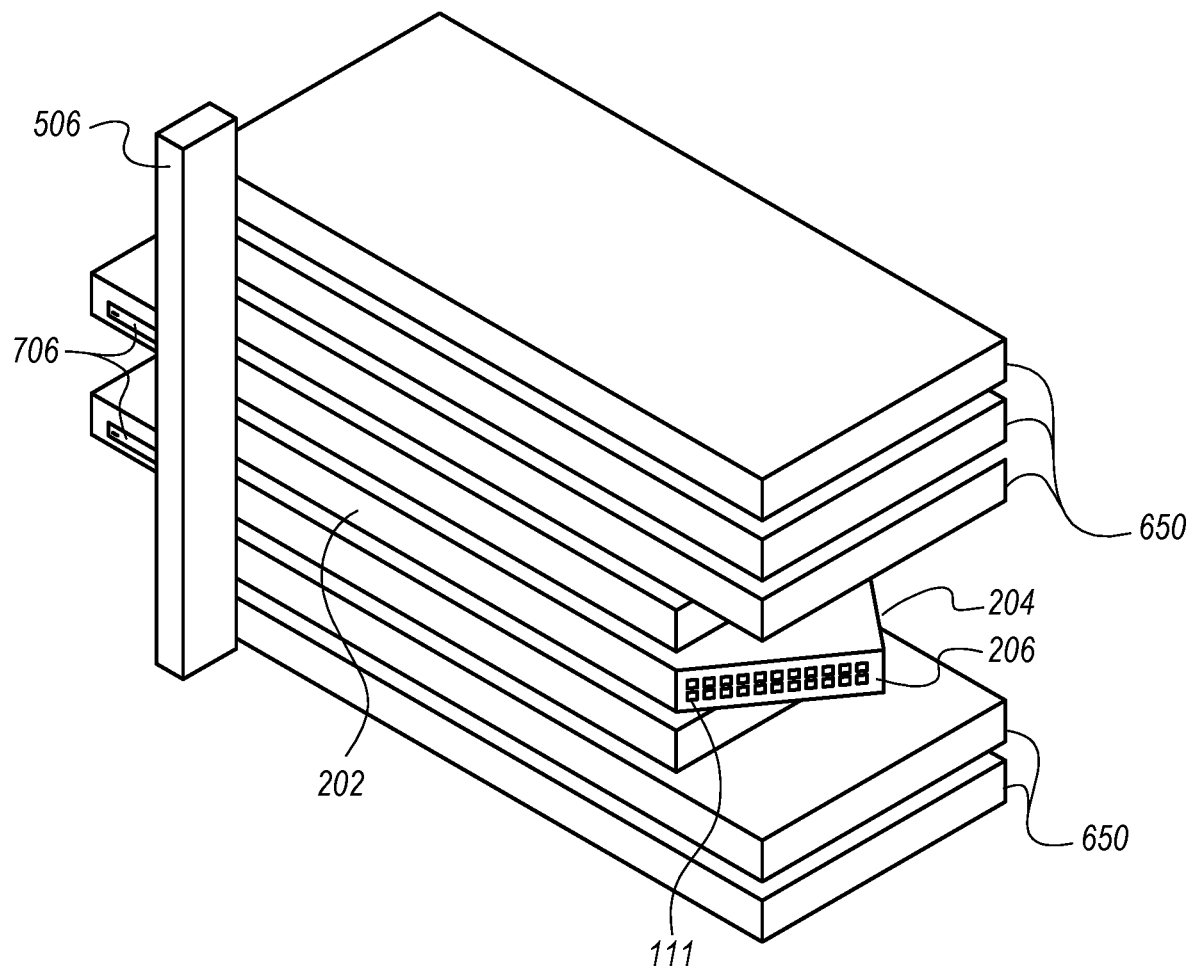
FIG. 17B illustrates a perspective view of a data center cabinet in one embodiment.
Figure 17C:
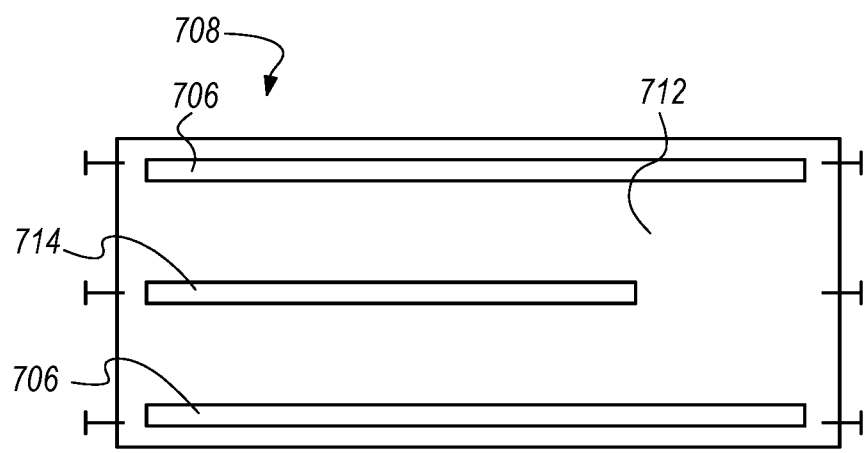
FIG. 17C illustrates a side elevation view of a weight-bearing structure for a cabinet in one embodiment.

As previously discussed in the analysis of U.S. Pat. No. 8,600,208 to Badar et al., and as shown in FIG. 17A, non-standard configurations of the rear port sides 204, 206 of switches 202, or other non-standard switch, can result in the network ports (female receiving connectors 111, 161, 191, or other connectors) being unreachable after the initial installation due to the servers 650 above and below the switch 202. The vertical space occupied by the switch 202 is less than two inches, which isn't sufficient for most datacenter techs to reach the network ports 111 located at the furthest edges of the rear port sides 204, 206. An improvement to the art addressing this difficulty is shown in FIG. 17B. The servers 650 may be mounted on sliding rails 706, which allow two or more servers above and below the switch 202 to be shifted towards the front of the cabinet, without coming all the way free of the cabinet, allowing a user to gain easier access to the rear port sides 204, 206 of the switch 202. Preferably, the mechanism that allows the servers to slide forward is engaged and disengaged from the back of the cabinet as well as the front of the cabinet. This is a major improvement to the art as it allows switches of new, higher port-density configurations to be mounted in positions other than the top of the cabinet and still have the network ports 111 (and 161 or 191 in other embodiments) accessible for routine maintenance. This improvement to the art could be combined with the previous embodiment allowing the switch to be racked from the front so that it can removed without requiring the removal of power distribution units and/or network cables. The sliding rails can be of a new design attached individually to the posts of the cabinet, or they can be consolidated together into a larger piece of mounting hardware as shown in FIG. 17C, comprising a weight-bearing structure 712, two or more sliding rails 706 for servers 650, and a fixed rail 714 for the switch.

Figure 18:
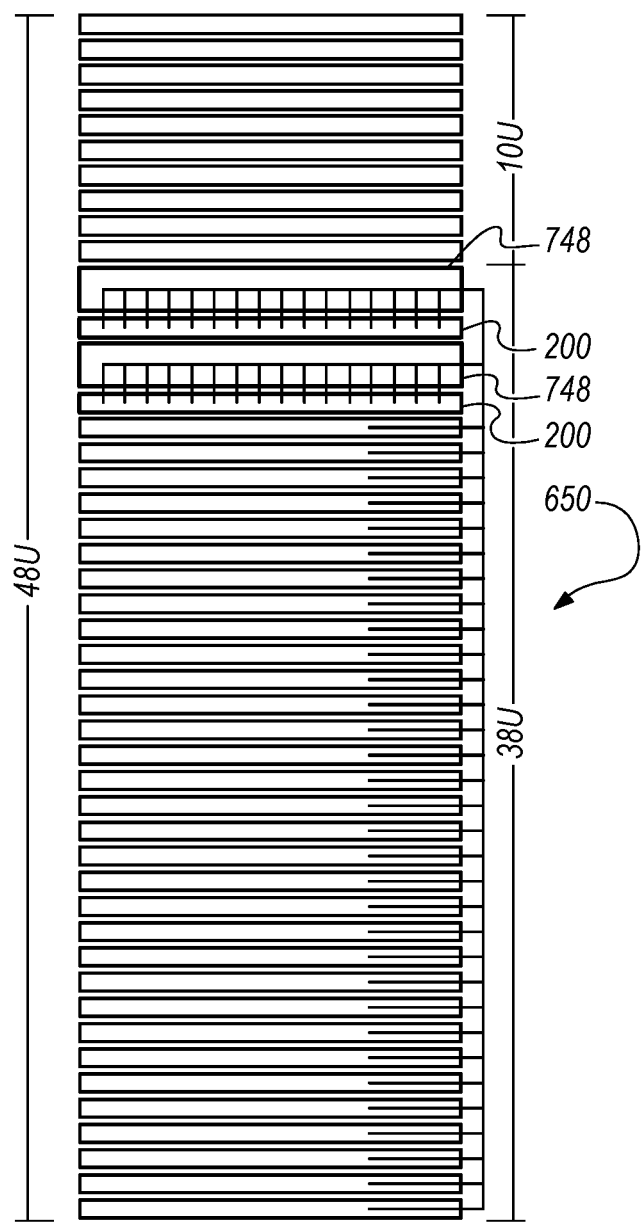
FIG. 18 illustrates a system and method of racking and cabling switches and servers of the prior art.
Figure 19:
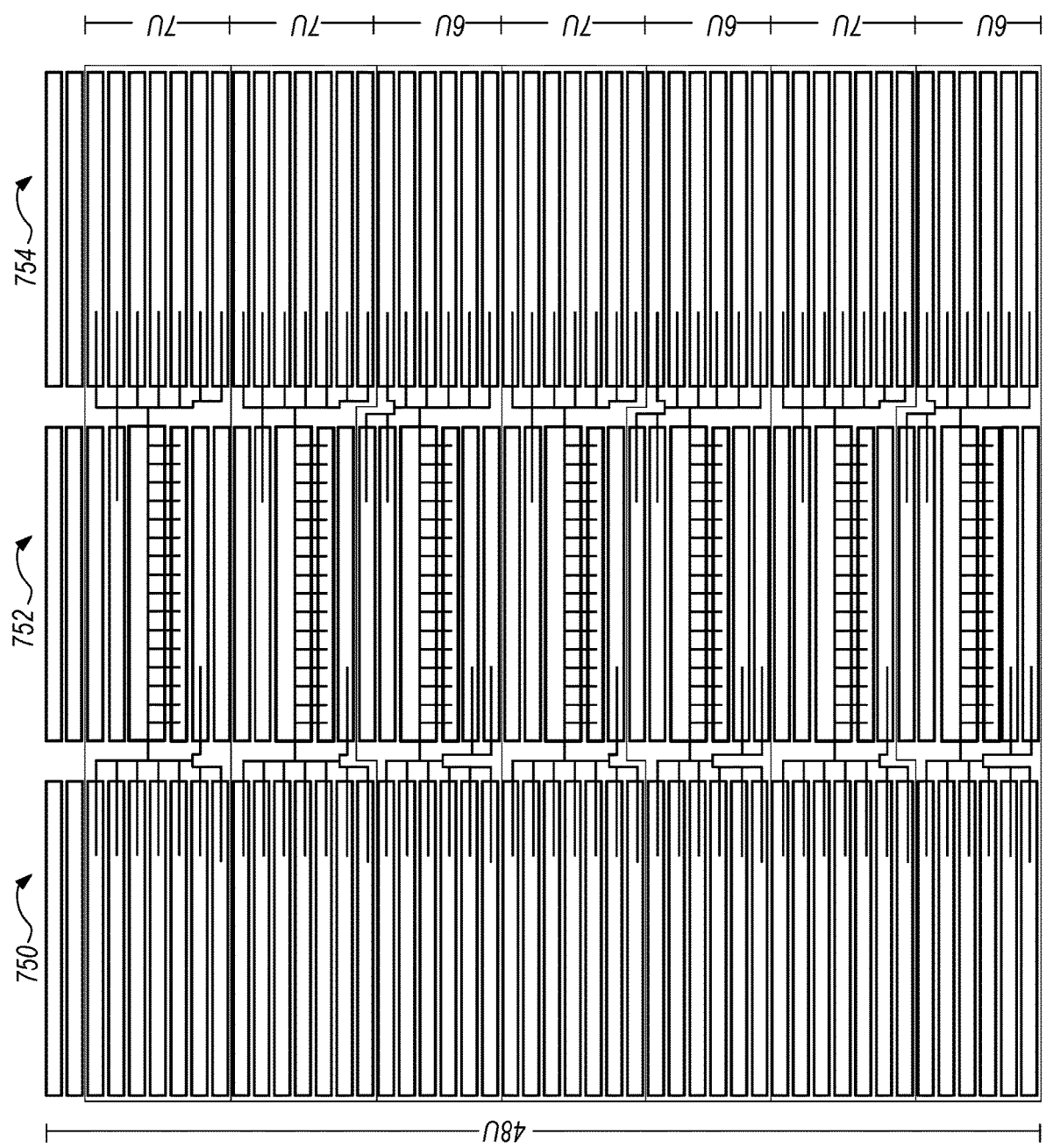
FIG. 19 illustrates a system and method of racking and cabling switches and servers in one embodiment.

FIG. 18 illustrates a rack in the prior art. As shown, two switches 200 (or other switches disclosed herein) are mounted in the rack above their respective servers 650, with cable management systems 748 mounted above each switch 200. FIG. 19 illustrates, in one embodiment, a method of configuring a logical computing unit or "LCU" (defined as a switch, its cable management system, and all of the servers attached to the switch). As shown in FIG. 19 in one example, there is a first cabinet 750, a second cabinet 752, and a third cabinet 754, wherein the second cabinet 752 is interposed between the first and third cabinets 750, 754 respectively, and comprises at least one networking switch 200. In the example of FIG. 19, the second cabinet 752 comprises seven LCUs, with each LCU comprising a switch 200. (A LCU could also comprise a plurality of switches). The first and third cabinets 750, 754 comprise a plurality of servers 650. The cabling from the first and third cabinets 750, 754 runs substantially horizontally to the second cabinet 752. In such an arrangement, it is possible to have at least one more switch (which allows for many more servers) in a 3-rack footprint than in the conventional method. Accordingly, cabling from the two outer cabinets 750, 754 to the inner cabinet 752 reduces the vertical space needed for a LCU in any one cabinet by roughly two-thirds. This is a minor concern for lower-density solutions where port utilization is only one port per unit (U) of server cabinet space; however, in higher-density solutions, where the port utilization per U of cabinet space is higher than 1 port per U, this method of cabling can also serve to fit a logical computing group (plurality of LCUs) into physical space that would otherwise be wasted by stacking multiple LCUs vertically inside a given group of three cabinets. Therefore, not only does this address instances where port utilization is less than 100%, it also addresses instances where port utilization is 100%, but the space inside a given cabinet is less than 100% utilized. As illustrated in FIG. 19, this is a major improvement in the art. In this particular embodiment, the server 650 and switch 200 density across the three cabinets is increased by ⅙th.

Figure 20:
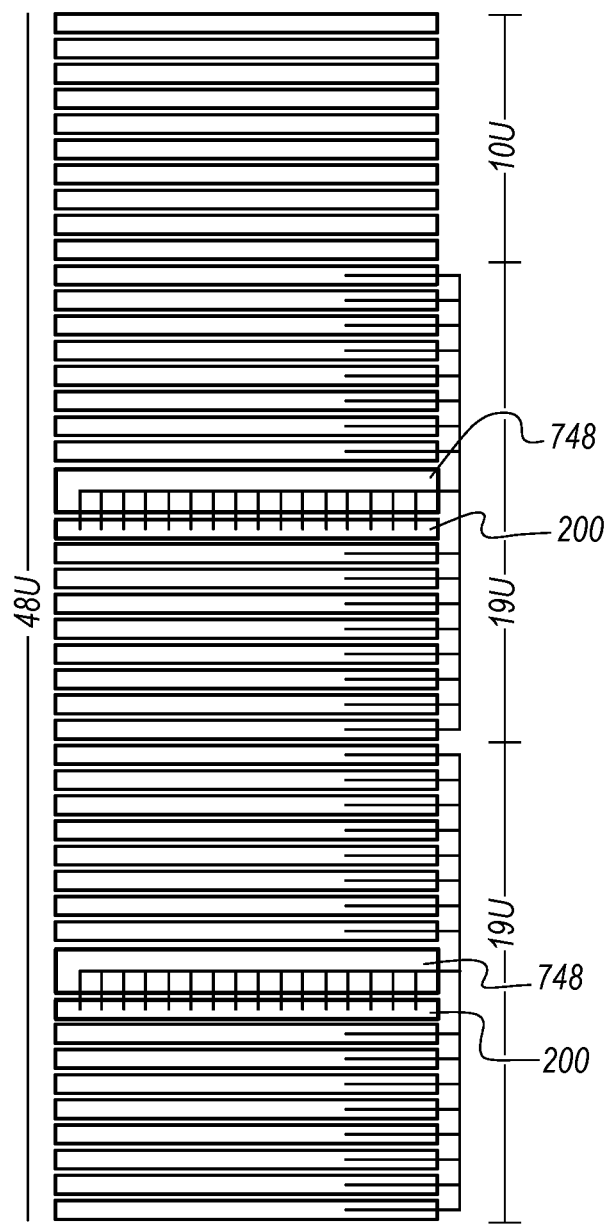
FIG. 20 illustrates a system and method of racking and cabling switches and servers in the prior art.
Figure 21:
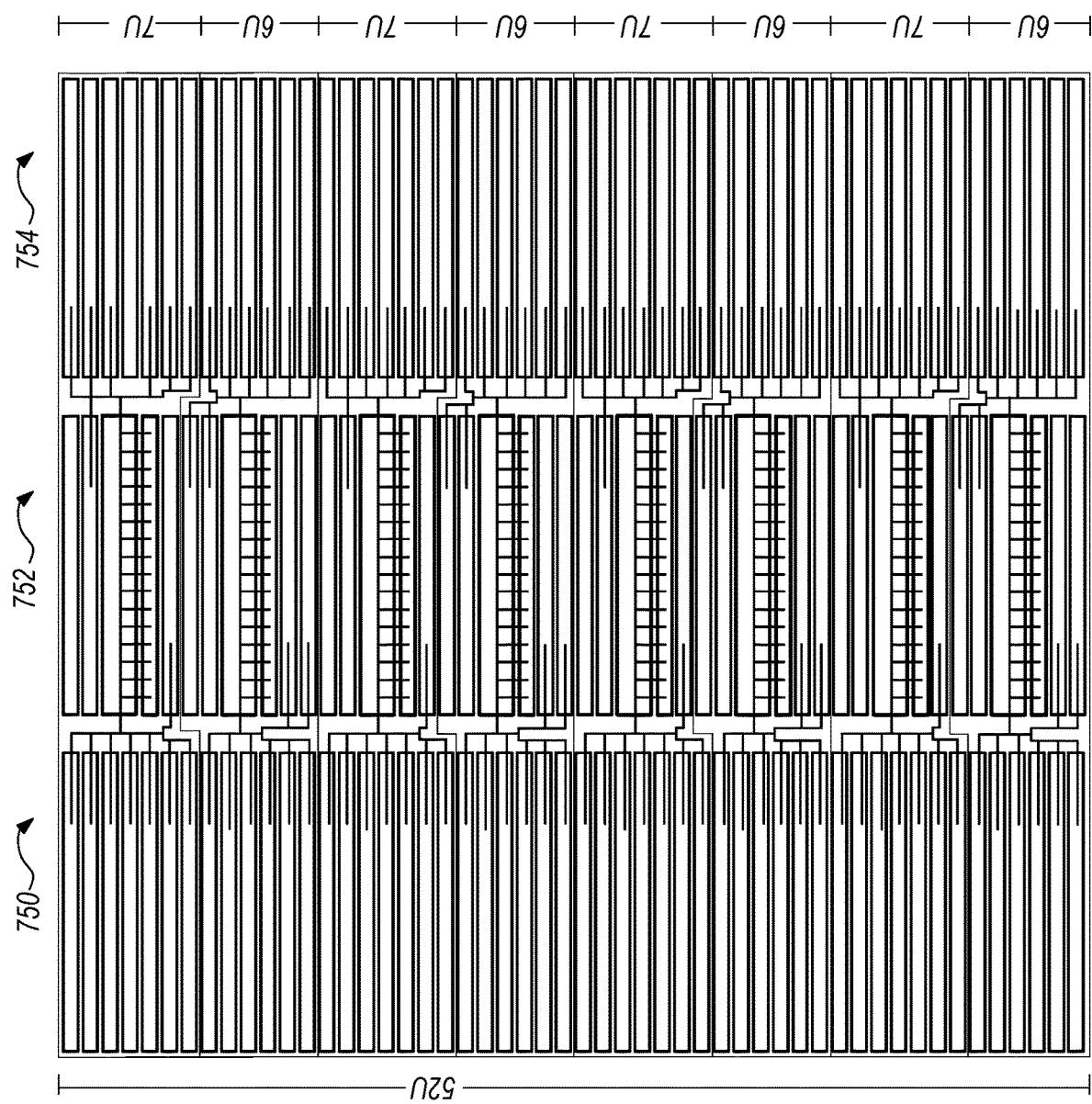
FIG. 21 illustrates a system and method of racking and cabling switches and servers in one embodiment.

Further, as illustrated by comparing FIGS. 20 and 21, this arrangement also unlocks the possibility of effectively utilizing the space in taller cabinets (52U as shown in FIG. 21), when the addition of four more U isn't enough to fit in another LCU inside just one cabinet, but where the additional space is sufficient to fit in an additional LCU when the vertical footprint is spread over three cabinets. In this particular embodiment a slight increase in the height of the cabinets, combined with cabling horizontally combines to increase the server and switch density across three cabinets by ⅓rd, which is a major improvement in the utilization of space inside a given datacenter. Furthermore, this change to the art involves a further reduction in the average length of cables running between the servers 650 and the switches 200. Current practice with top of the rack switches mounted at the top of the cabinet require networking cables that are on average half the aggregate vertical height of all of the servers in the cabinet plus the length needed to get from the port on the server over to the side of the cabinet, and then over from the side of the cabinet to the relevant port on the switch. As shown in FIG. 20, racking switches in the middle of the servers they connect to, drops the average length of the networking cables by ½, only ¼th the aggregate vertical height of the servers that the switch connects to, plus the length needed to get from the port on the server over to the side of the cabinet, and then over from the side of the cabinet to the relevant port on the switch. Racking switches and servers in LCU's that are spread horizontally across three cabinets further reduces the average length of the networking cables by an additional ⅔rds of the length involved in racking switches in the middle of a cabinet, which is ¹⁄₁₂th of the aggregate vertical height of the servers relating to a given switch, plus the length needed to get from the port on the server over to the side of the cabinet, and then over from the side of the cabinet to the relevant port on the switch. These shorter cables are not only cheaper, they also weigh less, which will reduce the incident of port failure on the switch.

In one embodiment, a cabling channel and a cable management system are mounted between the middle cabinet 752 and each of the first 750 and third 754 cabinets so as to protect the cabling. In other words, in an effort to prevent the cables from being exposed, one or more channels may be used. The channels may be fabricated from any number of materials (e.g., plastics, metals, etc.) and may be retrofitted to current cabinets in the art, or may be manufactured into newer cabinets. The channel not only keeps the cables protected and organized, but it further reduces the amount of weight that the cables exert on the ports.

Figure 22:
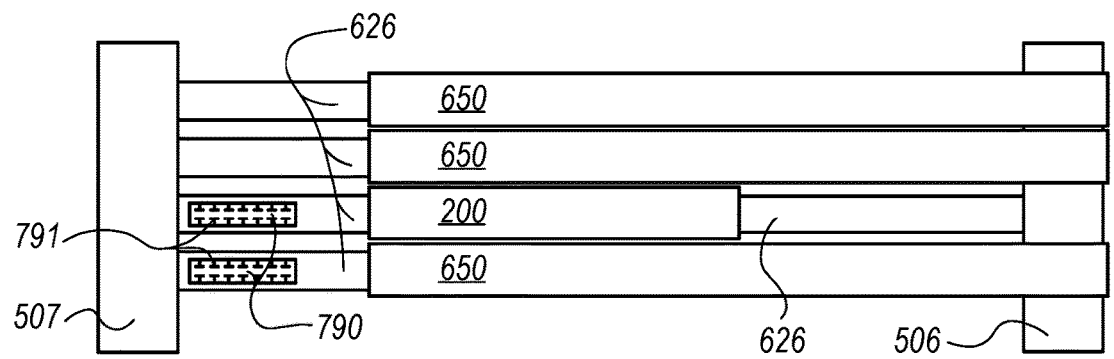
FIG. 22 illustrates a partial, side detailed view of a cabinet with switch, servers, rails, and horizontal cabling channel in one embodiment.
Figure 23:
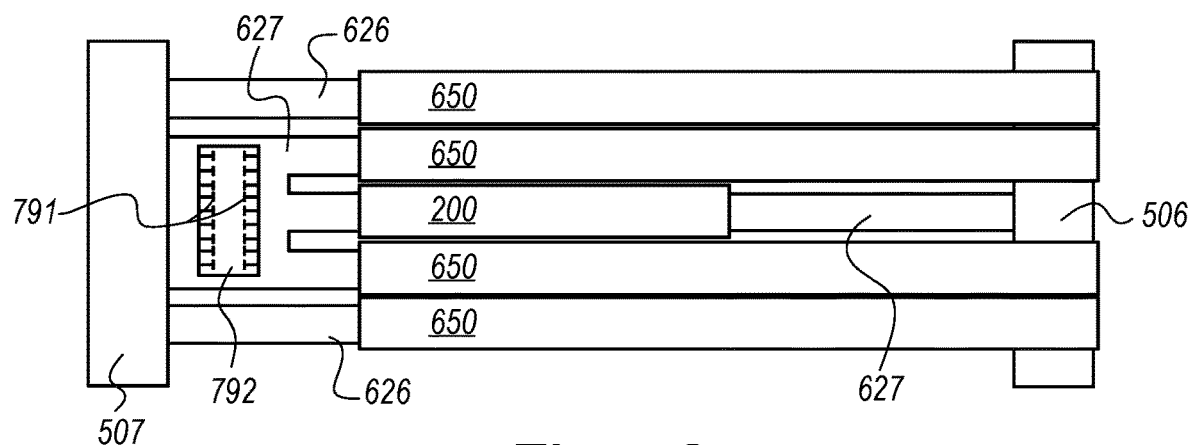
FIG. 23 illustrates a partial, side detailed view of a cabinet with switch, servers, rails, and horizontal cabling channel in one embodiment.
Figure 24:
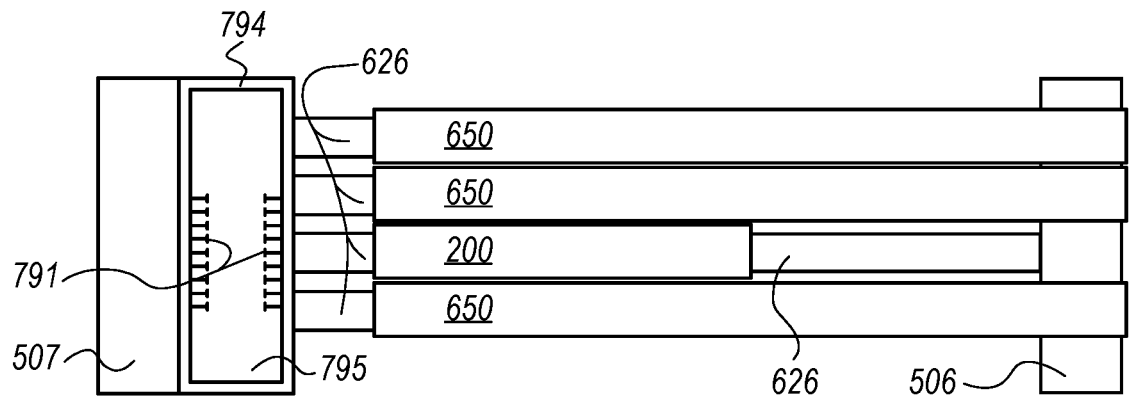
FIG. 24 illustrates a partial, side detailed view of a cabinet with switch, servers, rails, and horizontal cabling channel in one embodiment.
Figure 25:
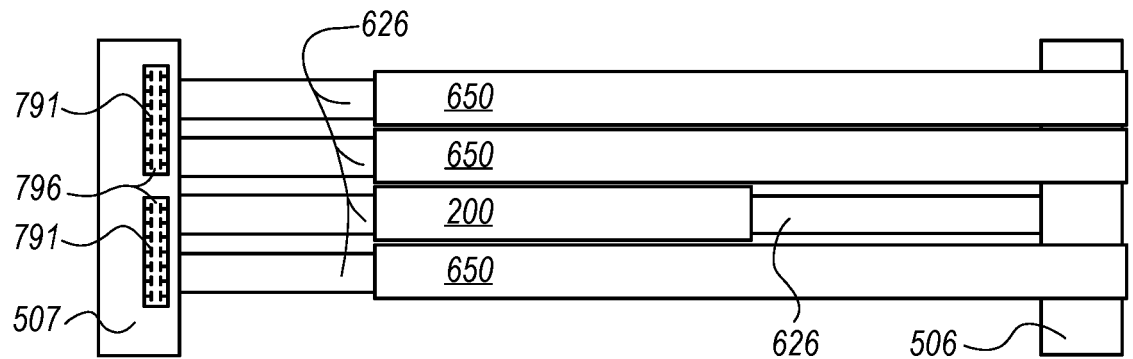
FIG. 25 illustrates a partial, side detailed view of a cabinet and cabinet posts with switch, servers, and horizontal cabling channel in one embodiment.
Figure 26:
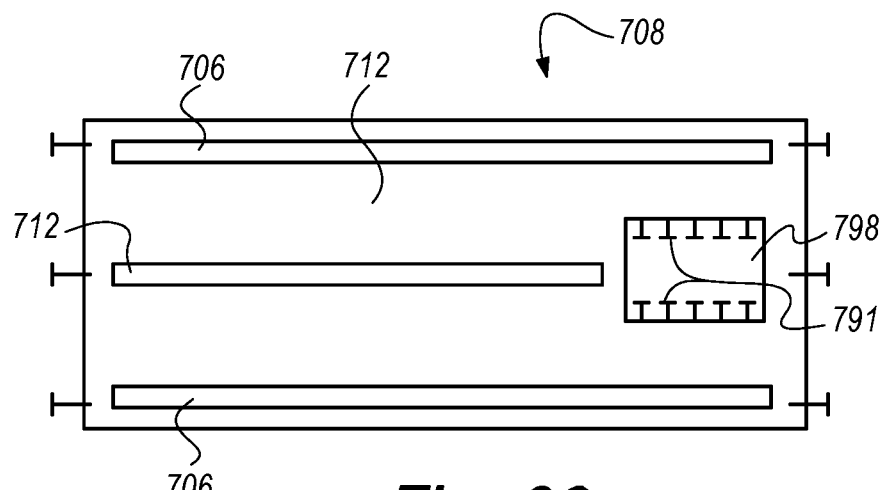
FIG. 26 illustrates a side elevation view of a weight-bearing structure for a cabinet in one embodiment.

FIG. 22 shows a detailed side view of a cabinet with a front post 506, a back cabinet post 507, a switch 200 and a plurality of servers 650. A cutout 790 forming a cabling channel is placed in one or more of the rails 626 used to mount the servers 650 and switch 200 to the cabinet posts 507 and 506, and cable management components 791 are placed inside of the cutout 790. As shown, cable management components 791 may be T-shaped protrusions (plastic, rubber, etc.) that secure the cables. However, it will be appreciated that the T-shape is not required, and that any cable securing/supporting configuration may be used. FIGS. 23-26 show other potential, non-limiting, configurations for enabling a cabling channel for purposes of running cabling horizontally across two or more cabinets. In FIG. 23, two or more of the mounting rails 626 are combined into a single bracket 627 which provides space for a larger cabling channel 792 and cable management components 791. In FIG. 24, a weight-bearing bracket 794 forming a cabling channel 795 and containing cable management components 791 is coupled to the back cabinet post 507 and then one or more of the mounting rails 626 are in turn coupled to the bracket 794. In FIG. 25, the back cabinet post 507 has one or more cabling channels 796 designed into it, along with cable management components 791. In FIG. 26, the sliding rail bracket embodiment from FIG. 17C is shown with the addition of a cabling channel 798 and cable management components 791, showing another non-limiting embodiment.

Figure 27A:
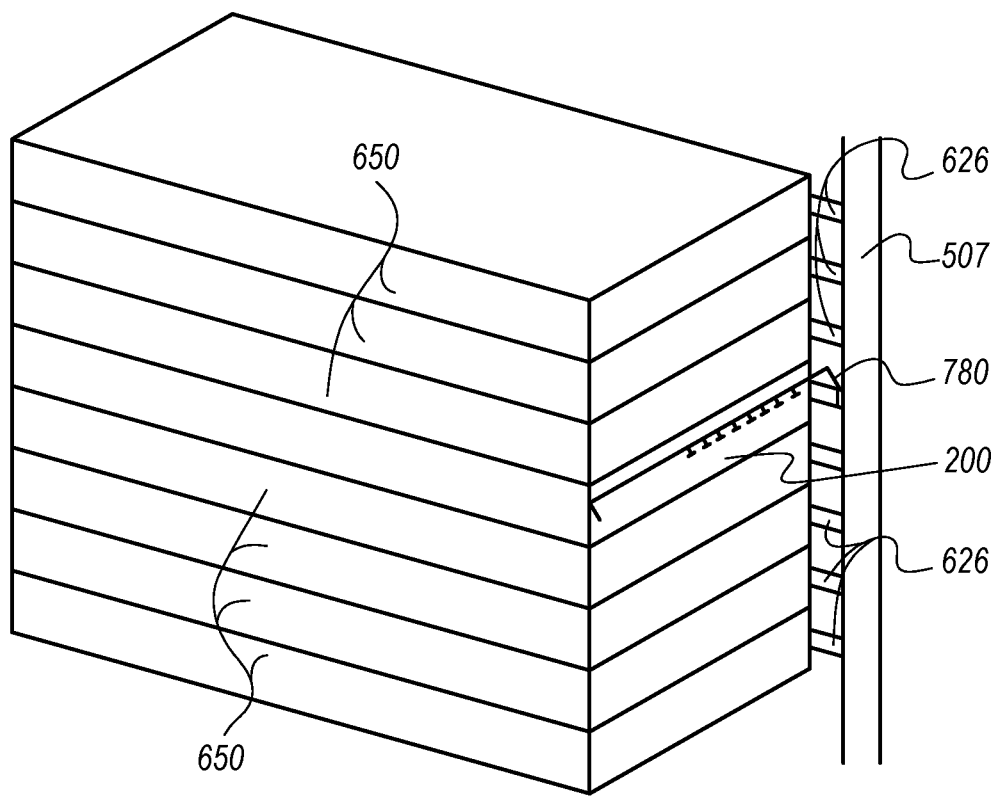
FIG. 27A illustrates a partial perspective view of a cabinet cable management system in one embodiment.
Figure 27B:
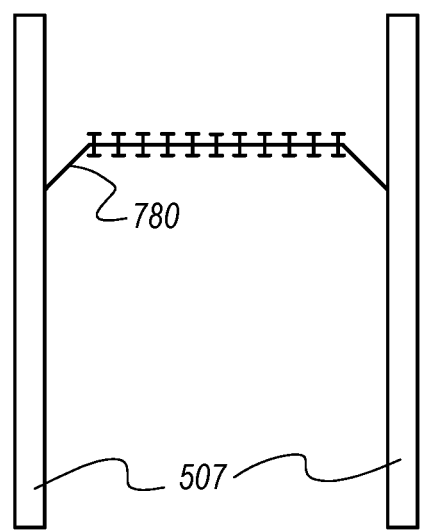
FIG. 27B illustrates a back view of a cabinet and cabling bar in one embodiment.
Figure 27C:
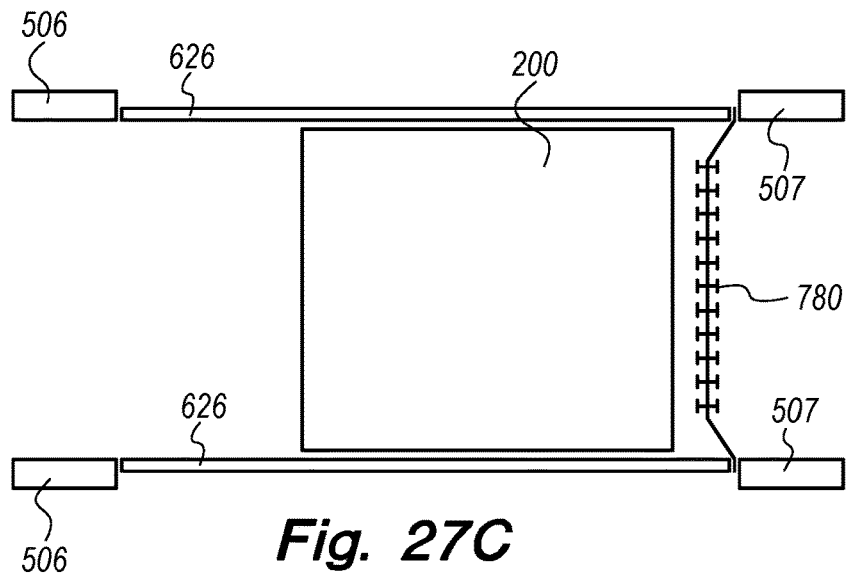
FIG. 27C illustrates a top plan view of a cabinet and cabling bar in one embodiment.
Figure 28:
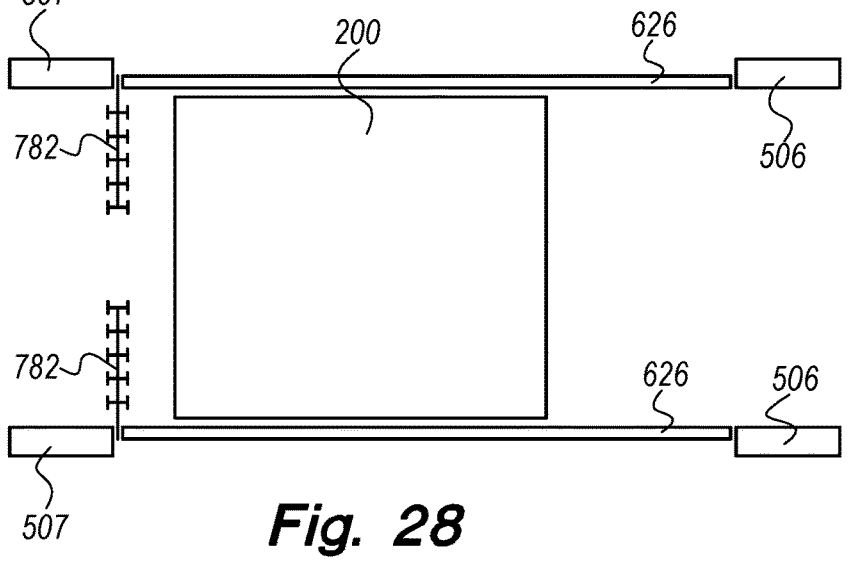
FIG. 28 illustrates a top plan view of a cabinet and cabling bars in one embodiment.
Figure 29:
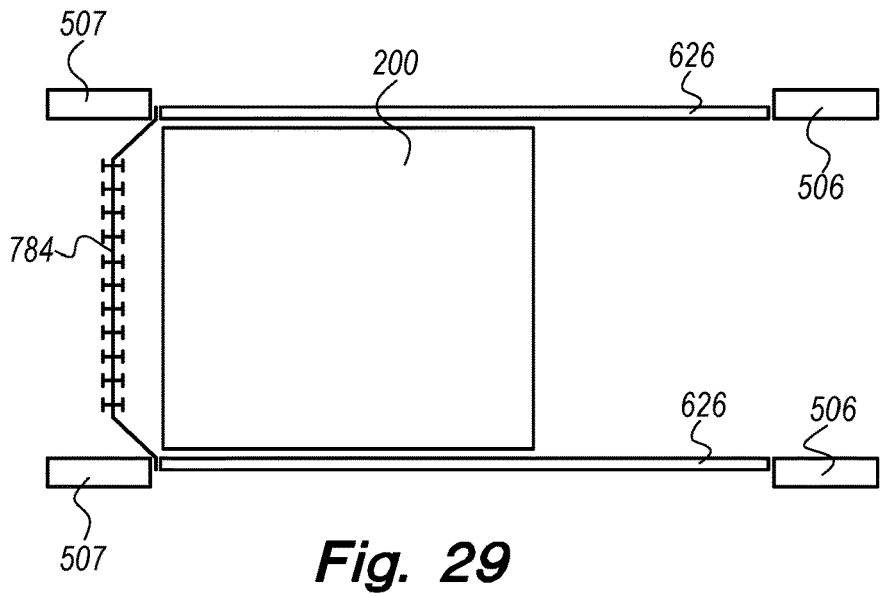
FIG. 29 illustrates a top plan view of a cabinet and cabling bar in one embodiment.
Figure 30:
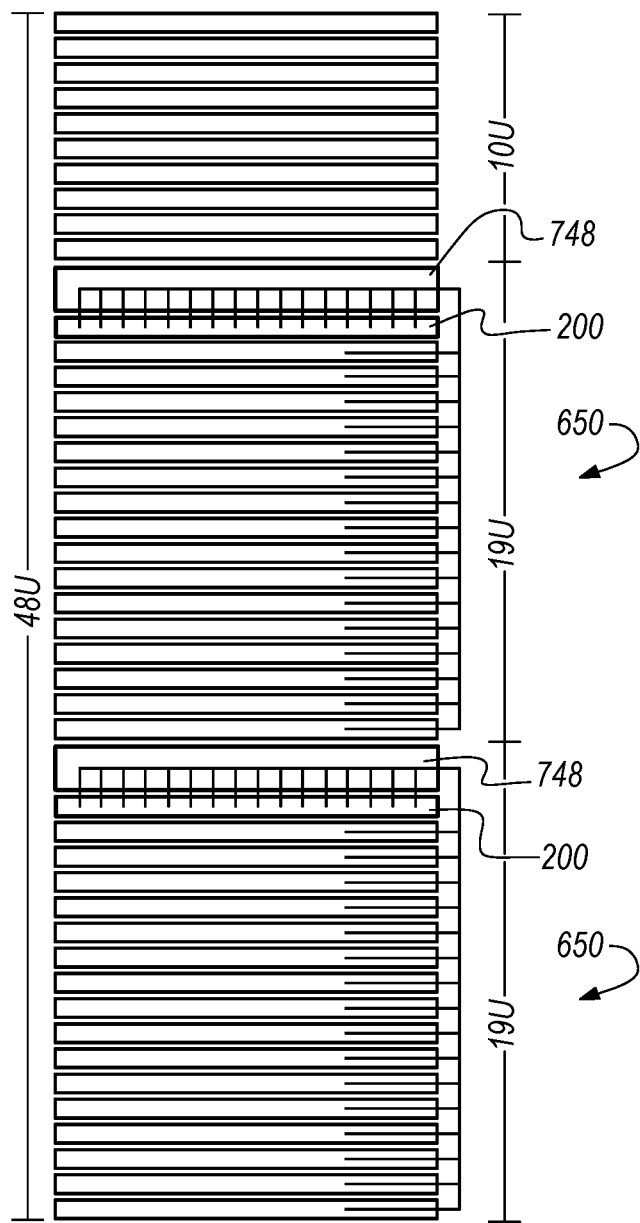
FIG. 30 illustrates a system and method of racking and cabling switches and servers in the prior art.

In one embodiment, as shown in FIGS. 27A-27C, from various angles, a weight-bearing cable management system 780 is mounted in-line behind the switch 200 rather than above the switch 200, as is customary in the industry. By mounting the cable management system 780 to the rear cabinet post 507 (either directly or between the rear post 507 and the rails 626), the housing of the switch 200, or the rails 626, the space above the switch 200 commonly used for a cable management system can be re-purposed and used to house additional servers 650. By comparing FIGS. 27A-27C with FIGS. 28 and 29, it becomes apparent that there are various possible arrangements involving differing positions of the switch 200 in relation to both the in-line cable management systems 780, 782, 784 and the back of the cabinet. Again, while switch 200 is used as an example, any switch, including those disclosed herein, may be used. The cable management systems 780, 782 and 784 can also take various forms including, but not limited to, a single bar stretching from one side of the cabinet to the other, multiple bars stretching partway across the back of the cabinet, and it may be angled towards, away, or parallel to the switch. This is a major improvement in the art. In the exemplary embodiment in FIG. 18, six LCUs are able to fit into three cabinets of either 48U or 52U. Spreading LCUs horizontally across three cabinets results in a more efficient utilization of the space and allows the provisioning of seven LCUs in three 48U cabinets, as shown in FIG. 19 or eight LCU's in three 52U cabinets as shown in FIG. 21.

Figure 31:
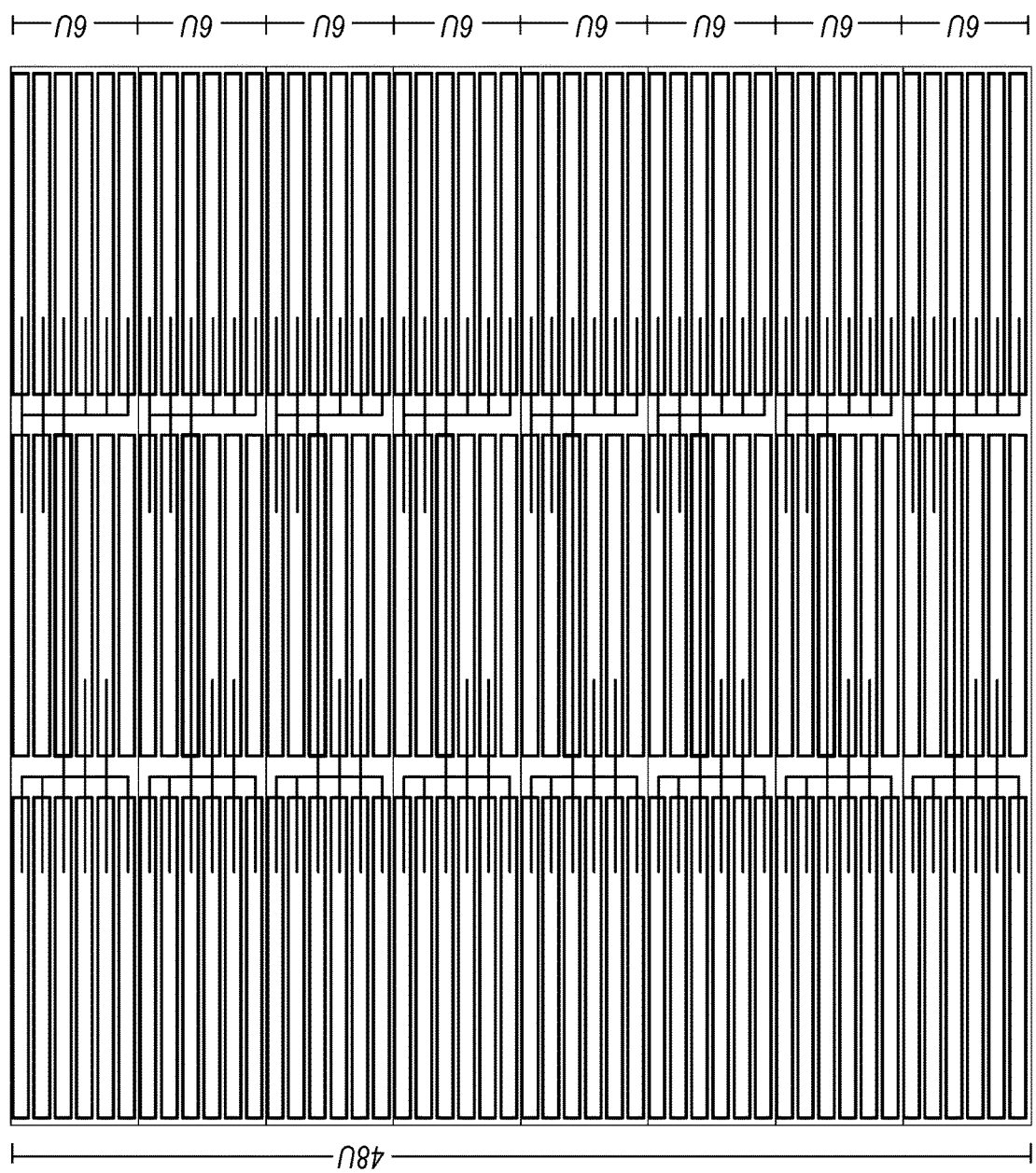
FIG. 31 illustrates a system and method of racking and cabling switches and servers in one embodiment.
Figure 32:
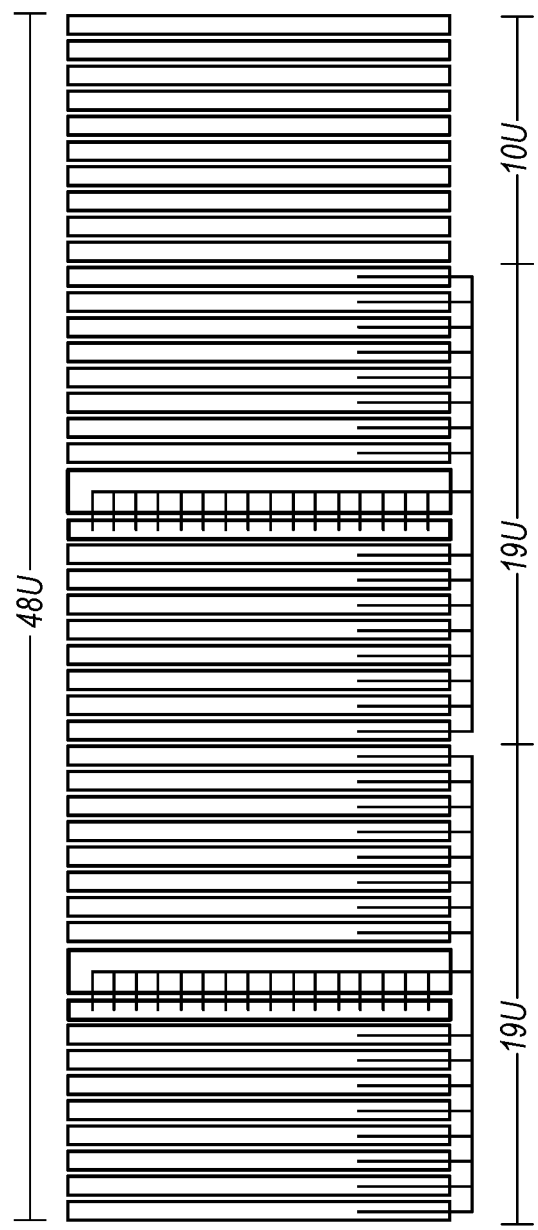
FIG. 32 illustrates a system and method of racking and cabling switches and servers in the prior art.
Figure 33:
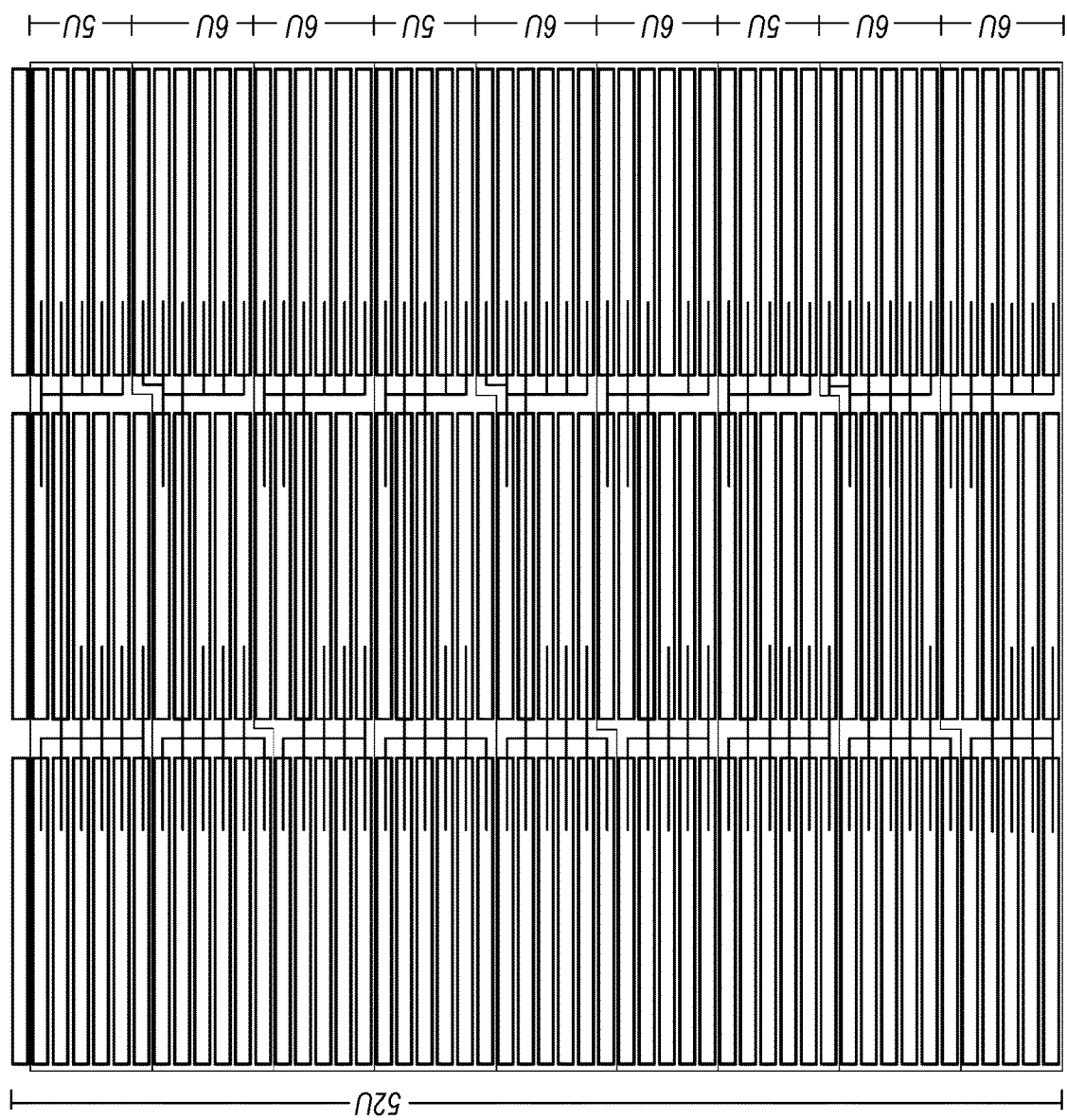
FIG. 33 illustrates a system and method of racking and cabling switches and servers in one embodiment.

As illustrated in FIG. 31, positioning the cable management system behind and in-line with the switch results in the ability to provision eight LCU's in a 48U cabinet and, as illustrated in FIG. 33, this same improvement of in-line cable management when combined with spreading the LCU's horizontally across three cabinets allows for nine LCU's in three 52U cabinets. The latter is an improvement of space utilization in this case of 50% over the current art.

In one embodiment, other channels may also be utilized, such as a cabling channel or protective sleeve that is configured to run vertically along the cabinet. These channels are useful for protecting fiber optic networking cables running vertically between switches. The channels may be fabricated from any number of materials (e.g., plastics, metals, etc.) and may be retrofitted to current cabinets in the art, or may be manufactured into newer cabinets.

Figure 34:
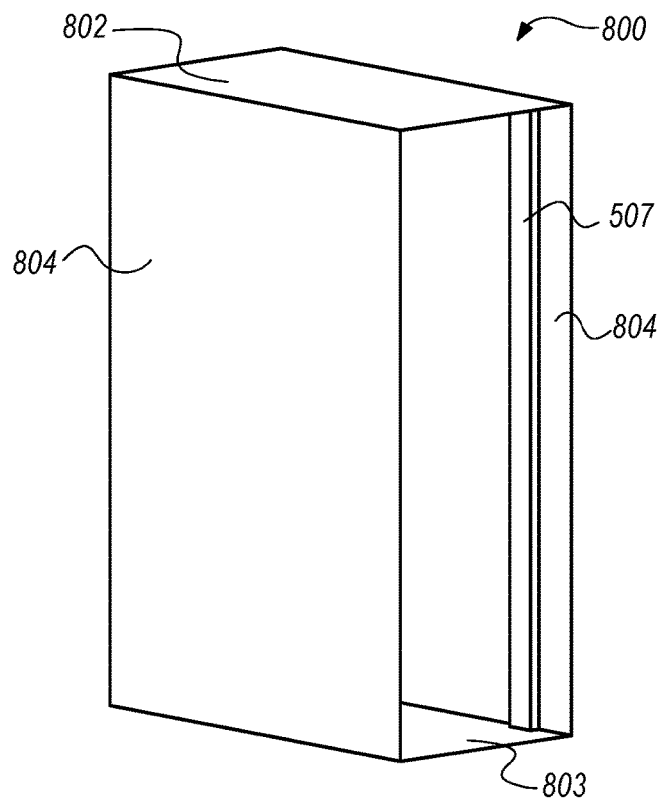
FIG. 34 illustrates a perspective view of a data center cabinet of the prior art.
Figure 35:
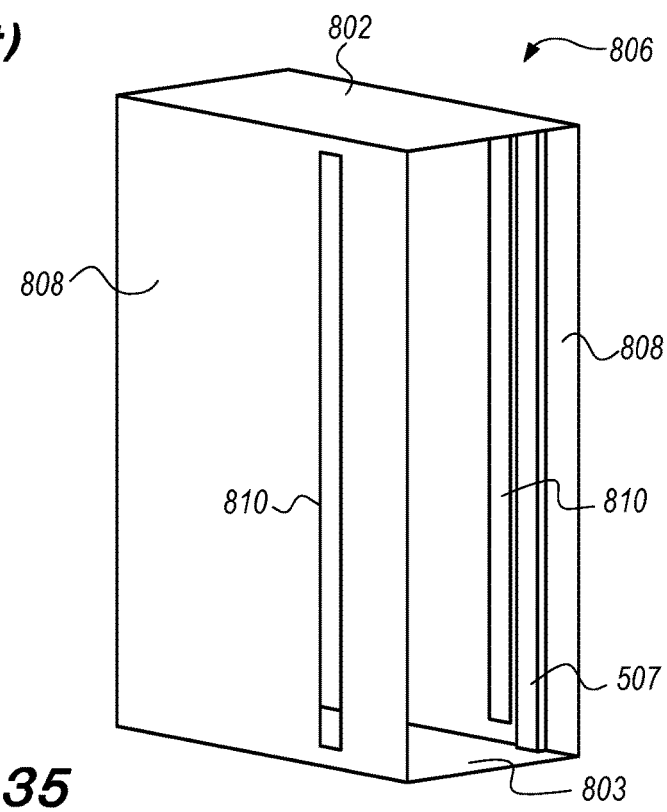
FIG. 35 illustrates a perspective view of a data center cabinet in one embodiment.
Figure 36:
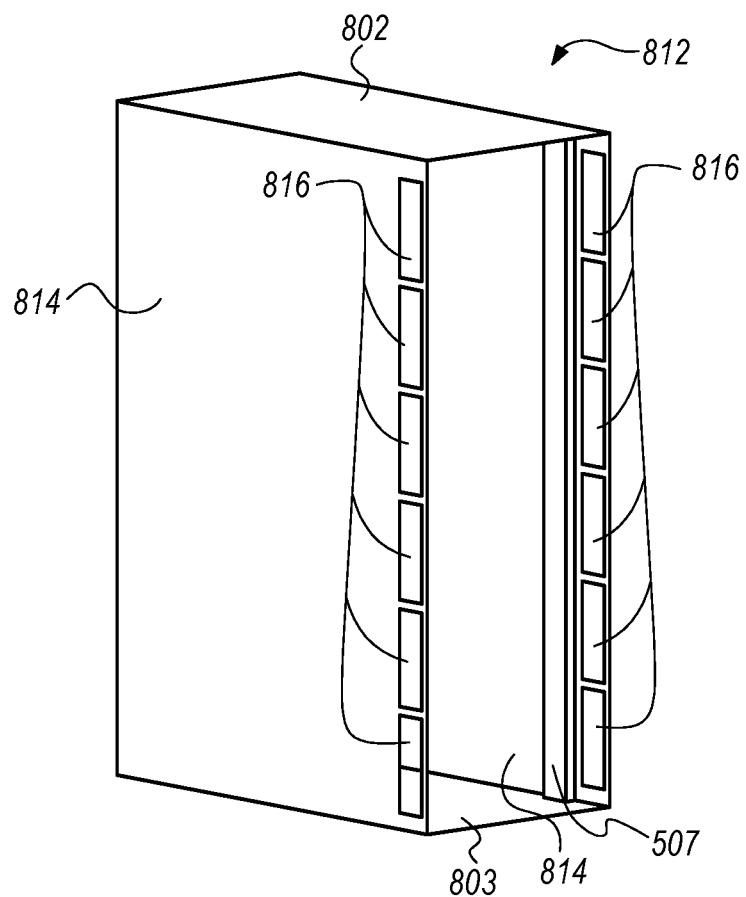
FIG. 36 illustrates a perspective view of a data center cabinet in one embodiment.

FIG. 34 illustrates a data center cabinet 800 of the prior art comprising a top 802, a bottom 803, two sides 804, two front posts 506 (not visible in this view) and two back posts 507 (only one visible in this view). Perforated front and back doors may also be included in the cabinet 800, or in any of the following cabinets described herein, but are omitted from this FIG. 34 and all other figures herein. FIG. 35 illustrates, in one embodiment, a data center cabinet 806 comprising a top 802, a bottom 803, two front posts 506 (not visible in this view), two back posts 507 (only one visible in this view), and two sides 808 in which cabling channels 810 (e.g., apertures) have been configured in front of and adjacent to back posts 507 to enable the horizontal cabling previously disclosed herein. The cabinet 806 may include protective inserts made out of plastic, rubber, or another material designed to protect the networking cables from the metal along the edges of the cabling channel 810. FIG. 36 illustrates, in one embodiment, a data center cabinet 812 comprising a top 802, a bottom 803, two front posts 506 (not visible in this view), two back posts 507 (only one visible in this view), and two sides 814 having multiple cabling channels 816 configured behind and adjacent to the back posts 507 to enable horizontal cabling to run therethrough. Those skilled in the art will readily appreciate that while six cabling channels 816 are shown in each side panel 814, a different number of channels may be used, and that while the cabling channels 810 are shown positioned in front of the back posts 507 and the channels 816 are shown positioned behind the pack posts 507, either configuration of cabling channels 810 and 816 could be placed in either position relative to the back posts 507, or even with the back posts 507.

Figure 37:
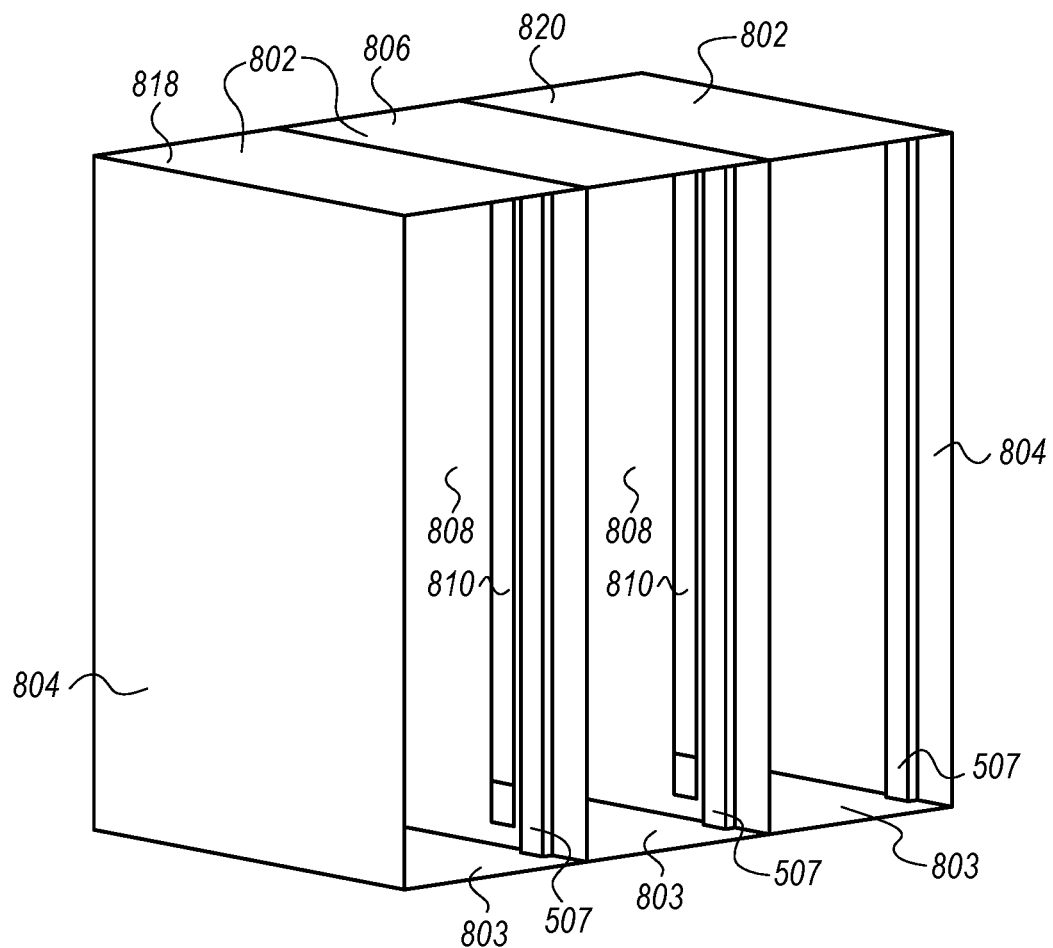
FIG. 37 illustrates a perspective view of multiple data center cabinets in one embodiment.

In one embodiment, as shown in FIG. 37, three data center cabinets 806, 818 and 820 are placed adjacent to each other. Each of the cabinets 806, 818, and 820 comprise tops 802, bottoms 803, two front posts 506 (not visible in this view), two back posts 507 (only one of which is visible in each cabinet). Cabinet 818 and 820 comprise one outer side panel 804 mounted on the side that is not adjacent to the other cabinets. These outer panels 804 do not include any kind of cabling cutout so as to protect the contents of the cabinets 818 and 820 from tampering. The cabinets 818 and 820 further comprise side panels 808 mounted on the sides adjacent to the other cabinets (i.e., interposed). Side panels 808 comprise cabling cutouts 810 which allow horizontal cabling from cabinets 818 and 820 to cabinet 806 which comprises two side panels 808 each of which comprises a cabling cutout 810 further enabling horizontal cabling to cabinet 806 from cabinets 818 and 820. Those skilled in the art will readily appreciate that this innovation can comprise just two cabinets with exterior side panels 804 and interior side panels 808 or 814 containing some form of cabling cutout/channel such as 810 or 816, or it could comprise more than three cabinets still having two exterior side panels 804 and multiple interior side panels 808 or 814 containing some form of cabling cutout such as 810 or 816.

Exemplary embodiments are described above. No element, act, or instruction used in this description should be construed as important, necessary, critical, or essential unless explicitly described as such. Although only a few of the exemplary embodiments have been described in detail herein, those skilled in the art will readily appreciate that many modifications are possible in these exemplary embodiments without materially departing from the novel teachings and advantages herein. Accordingly, all such modifications are intended to be included within the scope of this invention.

What is claimed is:

1. A male modular connector for terminating a cable and for making electrical contact external to the male modular connector, the male modular connector comprising:

a housing comprising a cable receiving end and a coupling end;

the coupling end comprising a first set of four electrical contacts on a first side and a second set of four electrical contacts on an opposite, second side, both sets of contacts being exposed for coupling with a female modular connector;

a wire insert for positioning and securing copper wires from the cable within the housing and to prevent unintended lateral, longitudinal, and transverse movement of the cable, the wire insert comprising a keyed portion to mate with a complementary keyed portion of the housing, the housing comprising at least one ramp for guiding the wire insert into the housing; and a retaining clip to ensure correct orientation of the male modular connector when inserted into the female modular connector and for releasing from the same;

wherein the housing is at least 20% narrower than 60603 standards for an 8P8C modular connector.

2. The male modular connector of claim 1, wherein the housing is elongated in relation to the IEC 60603 standards for an 8P8C modular connector and wherein the retaining clip is interposed between one set of electrical contacts and the cable receiving end.

3. The male modular connector of claim 1, wherein the housing is at least 40% narrower than the IEC 60603 standards for an 8P8C modular connector.

4. The male modular connector of claim 1, wherein the width of the housing is less than 0.35 inches.

5. The male modular connector of claim 1, wherein the electrical contacts are copper pins.

6. The male modular connector of claim 5, wherein the copper pins are at least 30% shorter than copper pins in the IEC 60603 standards for an 8P8C modular connector.

7. The male modular connector of claim 5, wherein the height of the copper pins is less than 0.12 inches.

8. The male modular connector of claim 1, wherein the first set of contacts comprises eight electrical contacts and wherein the second set of electrical contact comprises eight electrical contacts.

9. The male modular connector of claim 8, wherein the male modular connector approximates the dimensions of the IEC 60603 standards for an 8P8C modular connector.

10. The modular connector of claim 1, wherein the female modular connector comprises a first set of electrical contacts on a first side and a second set of electrical contacts on a second, opposite side, the first and second set of electrical contacts completing electrical circuits with the first and second set of electrical contacts of the male modular connector.

11. A male modular connector for terminating a cable and for making electrical contact external to the male modular connector, the male modular connector comprising:

a housing comprising a cable receiving end and a coupling end;

the coupling end comprising a set of electrical contacts on a first side, the contacts being exposed for coupling with a female connector;

a wire insert for positioning and securing copper wires from the cable within the housing and to prevent unintended lateral, longitudinal, and transverse movement of the cable, the wire insert comprising a keyed portion to mate with a complementary keyed portion of the housing, the housing comprising at least one ramp for guiding the wire insert into the housing; and a retaining clip to ensure correct orientation of the modular connector when inserted into a female connector and for releasing from the same;

wherein the electrical contacts are at least 40% shorter than the electrical contacts of the IEC 60603 standards for an 8P8C modular connector and wherein the housing is at least 20% shorter than the IEC 60603 standards for an 8P8C modular connector.

* * * * *